(12) United States Patent
Koo et al.

(10) Patent No.: US 7,250,629 B2
(45) Date of Patent: Jul. 31, 2007

(54) SEMICONDUCTOR DEVICE AND FLAT PANEL DISPLAY DEVICE HAVING THE SAME

(75) Inventors: Jae-Bon Koo, Suwon-si (KR); Min-Chul Suh, Suwon-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 180 days.

(21) Appl. No.: 11/186,750

(22) Filed: Jul. 22, 2005

(65) Prior Publication Data
US 2006/0027838 A1   Feb. 9, 2006

(30) Foreign Application Priority Data
Aug. 5, 2004   (KR) .................. 10-2004-0061670

(51) Int. Cl.
*H01L 29/15*   (2006.01)
(52) U.S. Cl. .................. 257/72; 257/59; 257/E29.151; 257/E51.005
(58) Field of Classification Search .................. 257/72
See application file for complete search history.

(56) References Cited
U.S. PATENT DOCUMENTS
5,847,413 A * 12/1998 Yamazaki et al. ............ 257/69
6,894,312 B2 * 5/2005 Yamazaki et al. ............ 257/72

FOREIGN PATENT DOCUMENTS
JP   2002-141511   5/2002
JP   2004-048036   2/2004

OTHER PUBLICATIONS
Korean Office Action of the Korean Patent Application No. 2004-61670, issued on May 4, 2006.

* cited by examiner

*Primary Examiner*—Tu-Tu Ho
(74) *Attorney, Agent, or Firm*—Robert E. Bushnell, Esq.

(57) ABSTRACT

A semiconductor device having two thin film transistors where cross-talk is minimized and a flat panel display device having the same. The semiconductor device includes a first electrode, a second electrode surrounding the first electrode in the same plane, a third electrode surrounding the second electrode in the same plane, a fourth electrode surrounding the third electrode in the same plane, a first gate electrode insulated from the first through fourth electrodes and arranged on another plane separate from the first through fourth electrodes to correspond to a space between the first electrode and the second electrode, a second gate electrode insulated from the first through fourth electrodes and arranged on yet another plane separate from the plane of the first through fourth electrodes to correspond to a space between the third electrode and the fourth electrode, and a semiconductor layer insulated from the first gate electrode and the second gate electrode and contacting the first through fourth electrodes.

40 Claims, 30 Drawing Sheets

SEMICONDUCTOR DEVICE AND FLAT PANEL DISPLAY DEVICE HAVING THE SAME

CLAIM OF PRIORITY

This application makes reference to, incorporates the same herein, and claims all benefits accruing under 35 U.S.C. §119 from an application for THIN FILM TRANSISTOR AND FLAT PANEL DISPLAY DEVICE THEREWITH earlier filed in the Korean Intellectual Property Office on 5 Aug. 2004 and there duly assigned Serial No. 10-2004-0061670.

BACKGROUND OF THE INVENTION

1. Field of the Invention

The present invention relates to a semiconductor device having thin film transistors (TFTs) and a flat panel display device having the same, and more particularly, to a semiconductor device design that minimizes cross-talk and a flat panel display device having the same.

2. Description of the Related Art

Designs for coplanar TFTs often have more than on TFT formed on a substrate side-by-side with each other. On top of the electrodes of the TFTs is an unpatterned semiconductor layer. Such a design has drawbacks in that crosstalk can occur between neighboring TFTs. One solution is to pattern the semiconductor layer. However, patterning the semiconductor layer, especially an organic semiconductor layer, has drawbacks in that the electrical characteristics of the patterned semiconductor layer become degraded, especially when the semiconductor layer is made of an organic material. Therefore, what is needed is a design for TFTs that can be used in a flat panel display that reduces crosstalk without degrading the electrical properties of the semiconductive material.

SUMMARY OF THE INVENTION

It is therefore an object of the present invention to provide an improved design for TFTs.

It is also an object of the present invention to provide an improved flat panel display using the novel TFTs.

It is yet another object of the present invention to provide a design for TFTs that reduces crosstalk between the TFTs and does not require patterning of the semiconductor layer.

It is still an object of the present invention to provide a design for TFTs that are easy to make by having fewer contact holes.

These and other objects can be achieved by a semiconductor device design that includes a first electrode arranged on a first plane, a second electrode surrounding the first electrode and arranged on the first plane, a third electrode surrounding the second electrode and arranged on the first plane, a fourth electrode surrounding the third electrode and arranged on the first plane, a first gate electrode insulated from the first through fourth electrodes and arranged on a second plane that is parallel to and different from the first plane, the first gate electrode corresponding to a space between the first electrode and the second electrode, a second gate electrode insulated from the first through fourth electrodes and arranged on a third plane that is parallel to and different from the first plane, the second gate electrode corresponding to a space between the third electrode and the fourth electrode and a semiconductor layer insulated from the first gate electrode and the second gate electrode and contacting the first through fourth electrodes.

The second plane and the third plane can be identical. The second gate electrode can partially surround the first gate electrode, and a protrusion protruding from the first gate electrode through an opening of the second gate electrode can be arranged in the first gate electrode. The second plane and the third plane can be arranged on a same side of the first plane. The semiconductor layer can be an organic semiconductor layer. The semiconductor device can further include a gate insulating layer insulating the first through fourth electrodes and the semiconductor layer from the first gate electrode and the second gate electrode.

According to another aspect of the present invention, there is provided a flat panel display device that includes a substrate, a first electrode arranged on a first plane, a second electrode surrounding the first electrode and arranged on the first plane, a third electrode surrounding the second electrode and arranged on the first plane, a fourth electrode surrounding the third electrode and arranged on the first plane, a first gate electrode insulated from the first through fourth electrodes and arranged on a second plane that is parallel to and different from the first plane, the first gate electrode corresponding to a space between the first electrode and the second electrode, a second gate electrode insulated from the first through fourth electrodes and arranged on a third plane that is parallel to and different from the first plane, the second gate electrode corresponding to a space between the third electrode and the fourth electrode, a semiconductor layer insulated from the first gate electrode and the second gate electrode and contacting the first through fourth electrodes, and a display element including a pixel electrode electrically connected to one of the first through fourth electrodes.

The second plane and the third plane can be identical, the second gate electrode can partially surrounding the first gate electrode. The second plane and the third plane can be closer to the substrate than the semiconductor layer and the first plane.

The pixel electrode can be connected to the first electrode. The flat panel display can further include a first capacitor electrode connected to the first gate electrode and a second capacitor electrode connected to the second electrode. The flat panel display can further include a gate insulating layer arranged on the substrate and covering the first gate electrode, the second gate electrode, and the first capacitor electrode and a protective layer arranged on the substrate and covering the first through fourth electrodes and the semiconductor layer, wherein the second plane and the third plane are closer to the substrate than the semiconductor layer and the first plane.

The second capacitor electrode can cover at least a portion of the protective layer. The third electrode can partially surround the second electrode, the fourth electrode can partially surround the third electrode, a protrusion can protrude from the second electrode through an opening of the third electrode and an opening of the fourth electrode and be arranged in the second electrode, the protrusion can be connected to the second capacitor electrode. The first through fourth electrodes can be arranged on the gate insulating layer, the semiconductor layer can be arranged to cover the first through fourth electrodes, and the second capacitor electrode can be arranged on the gate insulating layer. The semiconductor layer can be arranged on the gate insulating layer, the first through fourth electrodes can be arranged on the semiconductor layer, and the second capacitor electrode can be arranged on the semiconductor layer.

The first capacitor electrode can be connected to the third electrode. The fourth electrode can partially surround the third electrode, a protrusion that protrudes from the third electrode through the opening of the fourth electrode can be arranged in the third electrode, and the protrusion can be connected to the first capacitor electrode. The first capacitor electrode can be connected to the fourth electrode.

The pixel electrode can instead be connected to the second electrode. The flat panel display can further include a first capacitor electrode connected to the first gate electrode, and a second capacitor electrode connected to the first electrode. The flat panel display can also further include a gate insulating layer arranged on the substrate and covering the first gate electrode, the second gate electrode, and the first capacitor electrode, and a protective layer can be arranged on the substrate and covering the first through fourth electrodes and the semiconductor layer, wherein the first plane and the semiconductor layer can be further from the substrate than the second plane and the third plane.

The second capacitor electrode can be arranged above the protective layer. The second electrode can partially surround the first electrode, the third electrode can partially surround the second electrode, the fourth electrode can partially surround the third electrode, a protrusion can protrude from the first electrode through an opening of the second electrode, an opening of the third electrode, and an opening of the fourth electrode and be arranged in the first electrode, and the protrusion can be connected to the second capacitor electrode.

The first through fourth electrodes can be arranged on the gate insulating layer, the semiconductor layer can be arranged to cover the first through fourth electrodes, and the second capacitor electrode can be arranged on the gate insulating layer. The semiconductor layer can be arranged on the gate insulating layer, the first through fourth electrodes can be arranged on the semiconductor layer, and the second capacitor electrode can be arranged on the semiconductor layer.

The first capacitor electrode can be connected to the third electrode. The fourth electrode can partially surround the third electrode, a protrusion can protrude from the third electrode through the opening of the fourth electrode and be arranged in the third electrode, and the protrusion can be connected to the first capacitor electrode. The first capacitor electrode can be connected to the fourth electrode.

The pixel electrode can instead be connected to the third electrode. The flat panel display can further include a first capacitor electrode connected to the second gate electrode and a second capacitor electrode connected to the fourth electrode. The flat panel display can also further have the second gate electrode and the first capacitor electrode being arranged as one body, and the fourth electrode and the second capacitor electrode being arranged as one body. The flat panel display can also further include a gate insulating layer arranged on the substrate and covering the first gate electrode, the second gate electrode, and the first capacitor electrode, and a protective layer arranged on the substrate and covering the first through fourth electrodes and the semiconductor layer, wherein the first through fourth electrodes and the semiconductor layer can be arranged above the first gate electrode and the second gate electrode.

The first electrode can be connected to the second gate electrode. The second electrode can partially surround the first electrode, the third electrode can partially surround the second electrode, a protrusion can protrude from the first electrode through an opening of the second electrode and an opening of the third electrode can be arranged in the first electrode, and the protrusion can be connected to the second gate electrode. The second electrode can be connected to the second gate electrode. The third electrode can partially surround the second electrode, a protrusion can protrude from the second electrode through the opening of the third electrode and be arranged in the second electrode, and the protrusion can be connected to the second gate electrode.

The semiconductor layer can be an organic semiconductor layer. The light generated in the display element can be emitted away through the substrate. The display element can an electroluminescent element.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
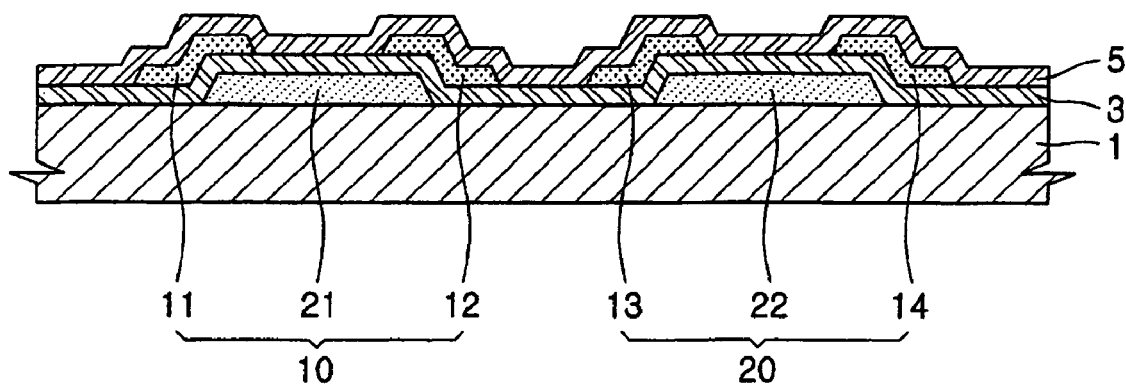
FIG. 1 is a schematic cross-sectional view of a semiconductor device having two thin film transistors (TFTs)

Turning now to the figures, FIG. 1 is a schematic cross-sectional view of an inverted coplanar semiconductor device having two thin film transistors (TFTs). Referring to FIG. 1, gate electrodes 21 and 22 are formed on a substrate 1, source electrodes 11 and 13 and drain electrodes 12 and 14 are formed above the gate electrodes 21 and 22, respectively, and a gate insulating layer 3 is interposed between the source electrode 11 and the gate electrode 21, between the drain electrode 12 and the gate electrode 21, between the source electrode 13 and the gate electrode 22, and between the drain electrode 14 and the gate electrode 22 so that the source electrodes 11 and 13 and the drain electrodes 12 and 14 are insulated from the gate electrodes 21 and 22. A semiconductor layer 5 contacts the source electrodes 11 and 13 and the drain electrodes 12 and 14, respectively. The source electrodes 11 and 13 and the drain electrodes 12 and 14 can be interchanged.

In the above structure, the semiconductor layer 5 is not patterned but is formed as a single body with two adjacent thin film transistors (TFTs) 10 and 20. In the design of FIG. 1, cross-talk in which adjacent TFTs affect one another due to a leakage current etc. can occur. Thus, in order to prevent cross-talk from occurring, the semiconductor layer 5 can be patterned to be separately used by each TFT. However, in the case of an organic TFTs using an organic semiconductor layer as the semiconductor layer 5, it is very difficult to pattern the semiconductor layer 5 and even though the organic semiconductor layer is patterned, electrical characteristics of the organic semiconductor layer are degraded.

Figure 2:
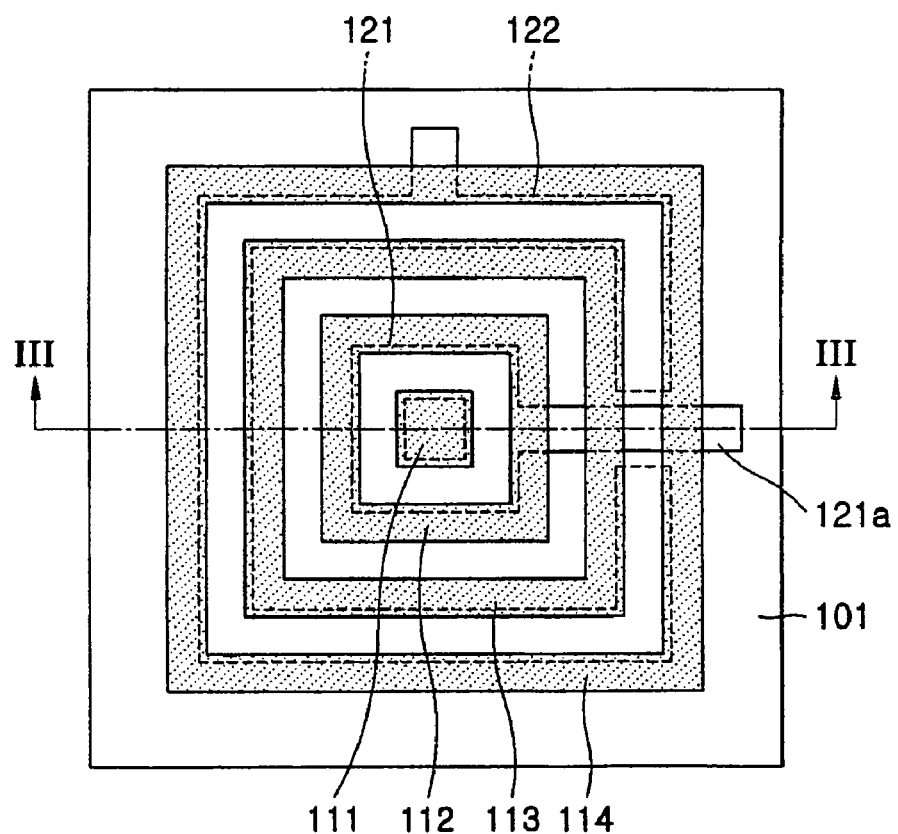
FIG. 2 is a schematic circuit diagram of a semiconductor device according to an embodiment of the present invention.
Figure 3:
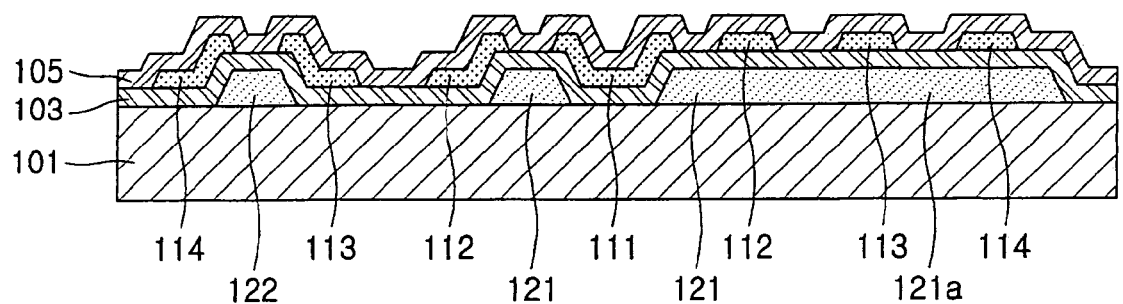
FIG. 3 is a cross-sectional view taken along line III—III of FIG. 2.

FIG. 2 is a schematic circuit diagram of a semiconductor device according to an embodiment of the present invention, and FIG. 3 is a cross-sectional view taken along line III—III of FIG. 2. Referring to FIGS. 2 and 3, a first electrode 111, a second electrode 112 that surrounds the first electrode 111 in the same first plane, a third electrode 113 that surrounds the second electrode 112 in the same first plane, and a fourth electrode 114 that surrounds the third electrode 113 in the same first plane are formed on a substrate 101. A first gate electrode 121, which is insulated from the first through fourth electrodes 111, 112, 113, and 114 and located on a second plane separate from and parallel to the first plane the first through fourth electrodes to correspond to a space between the first electrode 111 and the second electrode 112, and a second gate electrode 122, which is insulated from the first through fourth electrodes 111, 112, 113, and 114 and located on a third plane separate from and parallel to the first plane the first through fourth electrodes to correspond to a space between the third electrode 113 and the fourth electrode 114, are formed on the substrate 101. A semiconductor layer 105, which is insulated from the first gate electrode 121 and the second gate electrode 122 and contacts the first through fourth electrodes 111, 112, 113, and 114, is further formed on the substrate 101. In particular, the semiconductor layer 105 can be an organic semiconductor layer, and this variation is applied to embodiments that will be described later.

In this embodiment, the first gate electrode 121 and the second gate electrode 122 can be formed in the same plane. In particular, the second gate electrode 122 can partially surround the first gate electrode 121, and a protrusion 121a that protrudes from the first gate electrode 121 through an opening of the second gate electrode 122 can be formed in the first gate electrode 121. Because of the protrusion 121a, an external device can be easily connected to the first gate electrode 121 which the second gate electrode 122 surrounds.

The first through fourth electrodes 111, 112, 113, and 114 are source electrodes and drain electrodes of TFTs. FIGS. 2 and 3 illustrate two TFTs where the first electrode 111, the second electrode 112, and the first gate electrode 121 are included in one TFT, and the third electrode 113, the fourth electrode 114, and the second gate electrode 122 are included in the other TFT. In each of the TFTs, one of a source electrode and a drain electrode surrounds the other electrode thereof, and simultaneously, a source electrode and a drain electrode of one TFT are surrounded by a source electrode and a drain electrode of the other TFT. In this embodiment, if one of the first electrode 111 and the second electrode 112 is a source electrode, the other electrode thereof is a drain electrode.

As described above, when a semiconductor layer, in particular, an organic semiconductor layer is not patterned but is formed as a single body with two or more adjacent TFTs, cross-talk in which adjacent TFTs affect one another due to a leakage current etc. can occur. Thus, in order to prevent cross-talk from occurring, the source electrode and the drain electrode of each TFT as above should have a structure where one electrode surrounds the other electrode in the same plane. In other words, in the above structure, a channel formed by the first gate electrode 121 is formed only between the first electrode 111 and the second electrode 112 that surrounds the first electrode 111 in the same plane and further, current flows only between the first electrode 111 and the second electrode 112 that surrounds the first electrode 111 in the same plane. By doing so, cross-talk between adjacent TFTs can be prevented even though the semiconductor layer 105 is not patterned.

In this embodiment, when two TFTs are arranged in parallel, the area of the two TFTs greatly increases, especially when the two TFTs include a first electrode, a second electrode that surrounds the first electrode in the same plane, and a gate electrode located on a separate but parallel plane to the plane of first electrode and the second electrode to correspond to a space between the first electrode 111 and the second electrode 112 are arranged in parallel. Thus, as shown in FIGS. 2 and 3, a source electrode and a drain electrode of one TFT are surrounded in the same plane by a source electrode and a drain electrode of the other TFT such that the area of the two TFTs can be greatly reduced.

The TFTs shown in FIGS. 2 and 3 include a gate insulating layer 103 that insulates the first through fourth electrodes 111, 112, 113, and 114 and the semiconductor layer 105 from the first gate electrode 121 and the second gate electrode 122. The TFTs are inverted coplanar TFTs where the first through fourth electrodes 111, 112, 113, and 114 are formed on the first gate electrode 121 and the second gate electrode 122 and in particular, the semiconductor layer 105 is formed on the first through fourth electrodes 111, 112, 113, and 114. However, the TFTs can also be inverted staggered TFTs where the first through fourth electrodes 111, 112, 113, and 114 are formed on the semiconductor layer 105. In other words, when one of a source electrode and a drain electrode of a TFT surrounds the other electrode thereof in the same plane and a source electrode and a drain electrode of one TFT are surrounded by a source electrode and a drain electrode of the other TFT, the TFTs can be either inverted coplanar TFTs or inverted staggered TFTs. This variation is applied to embodiments that will be described later.

The first gate electrode 121 can be located on a separate but parallel plane to the plane of the first electrode 111 and the second electrode 112 to correspond only to a space between the first electrode 111 and the second electrode 112 that surrounds the first electrode 111 in the same plane, that is, the first gate electrode 121 has a donut shape where a middle portion of the first gate electrode 121 is empty. This is because when the first gate electrode 121 is not formed in a donut shape and forms a capacitor structure with the first electrode 111, a parasitic capacitance between the first electrode 111 and the first gate electrode 121 can occur.

Figure 4:
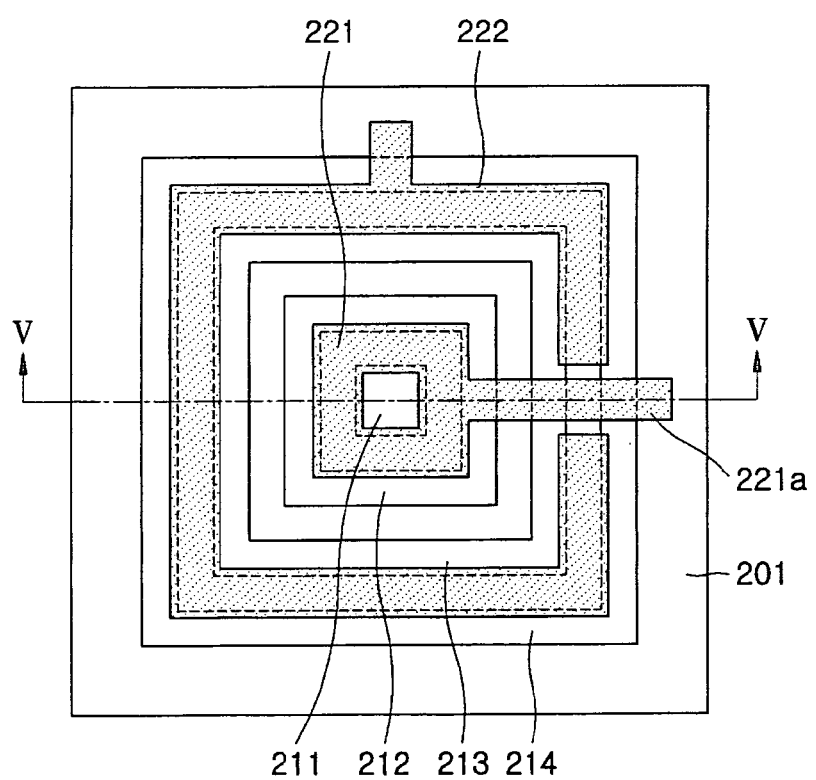
FIG. 4 is a schematic plane view of a semiconductor device according to another embodiment of the present invention.
Figure 5:
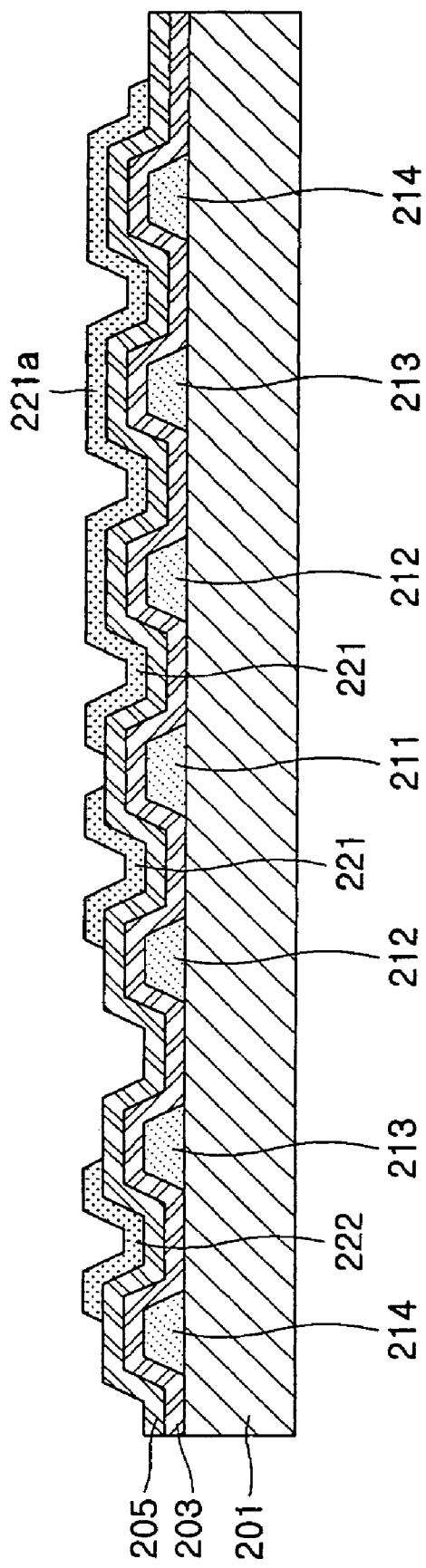
FIG. 5 is a cross-sectional view taken along line V—V of FIG. 4.

Turning now to FIG. 4, FIG. 4 is a schematic circuit diagram of a semiconductor device according to another embodiment of the present invention, and FIG. 5 is a cross-sectional view taken along line V—V of FIG. 4. Referring to FIGS. 4 and 5, TFTs shown in FIGS. 4 and 5 are different from the TFTs shown in FIGS. 2 and 3 in that the TFTs shown in FIGS. 4 and 5 are staggered TFTs where a first gate electrode 221 and a second gate electrode 222 are formed on first through fourth electrodes 211, 212, 213, and 214 and a semiconductor layer 205. As shown in FIGS. 4 and 5, when one of a source electrode and a drain electrode of a TFT surrounds the other electrode thereof in the same plane and a source electrode and a drain electrode of one TFT are surrounded by a source electrode and a drain electrode of the other TFT, the present invention can be applied to either an inverted coplanar TFT or an inverted staggered TFT.

Figure 6:
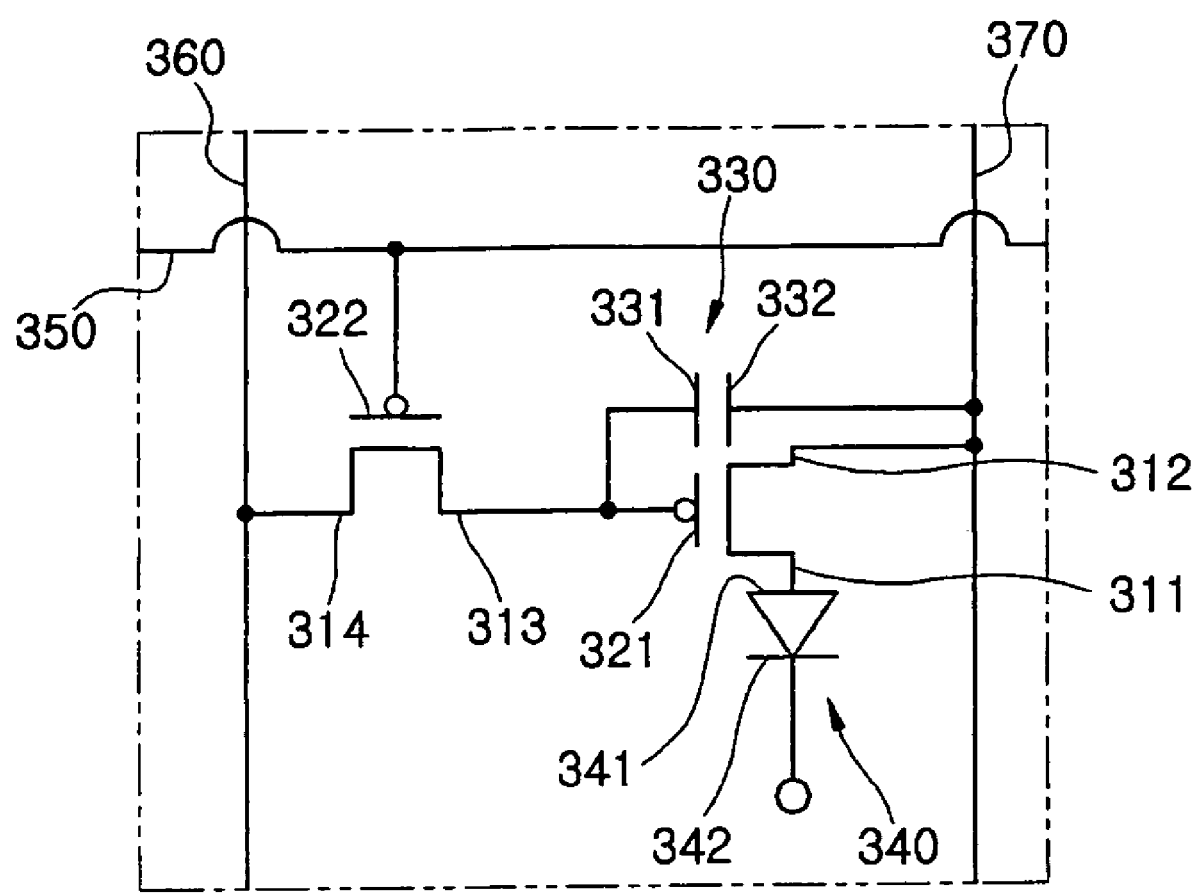
FIG. 6 is a schematic circuit diagram of a subpixel unit of an electroluminescent display device according to another embodiment of the present invention.
Figure 7:
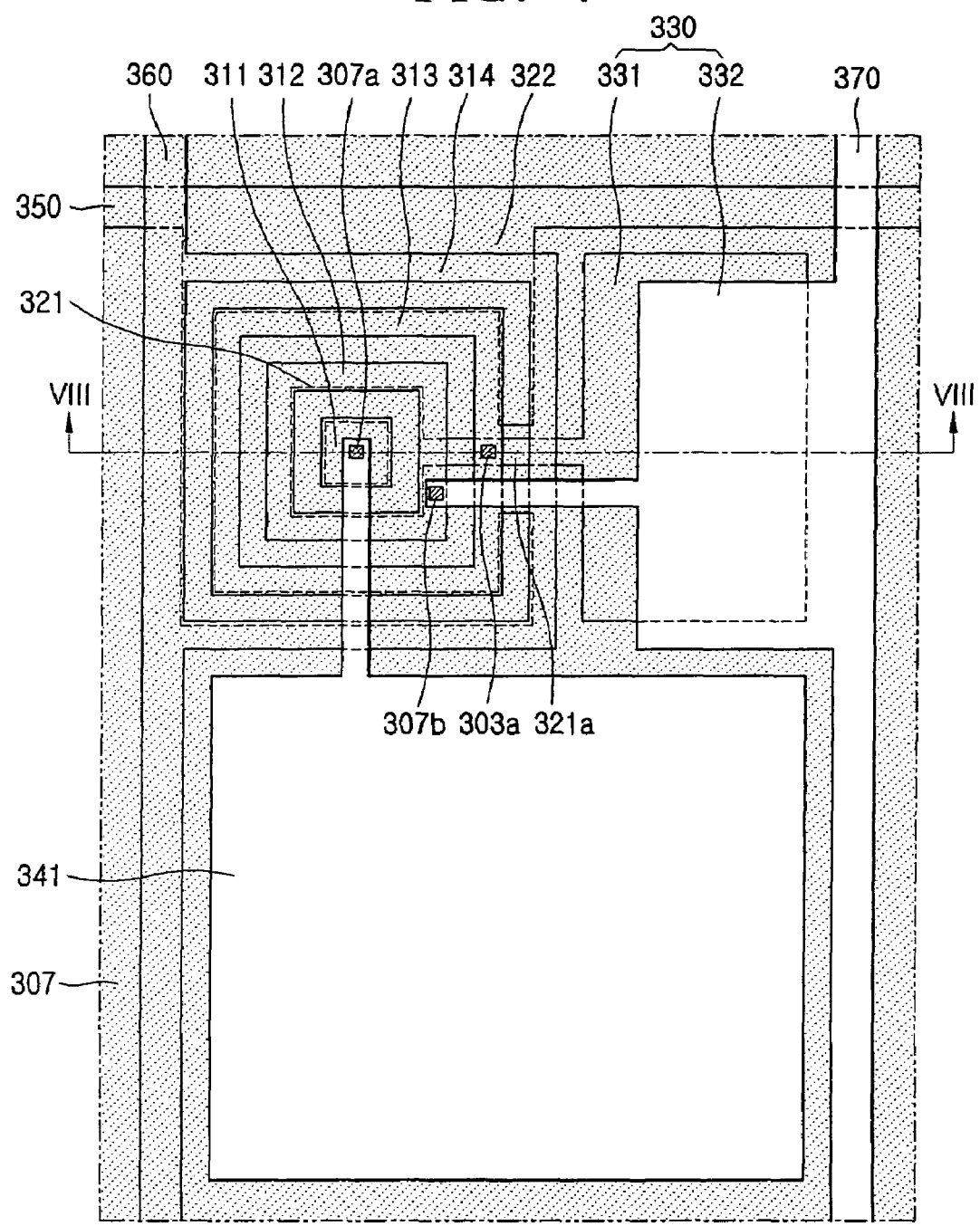
FIG. 7 is a schematic plane view of the subpixel unit of the electroluminescent display device shown in FIG. 6.
Figure 8:
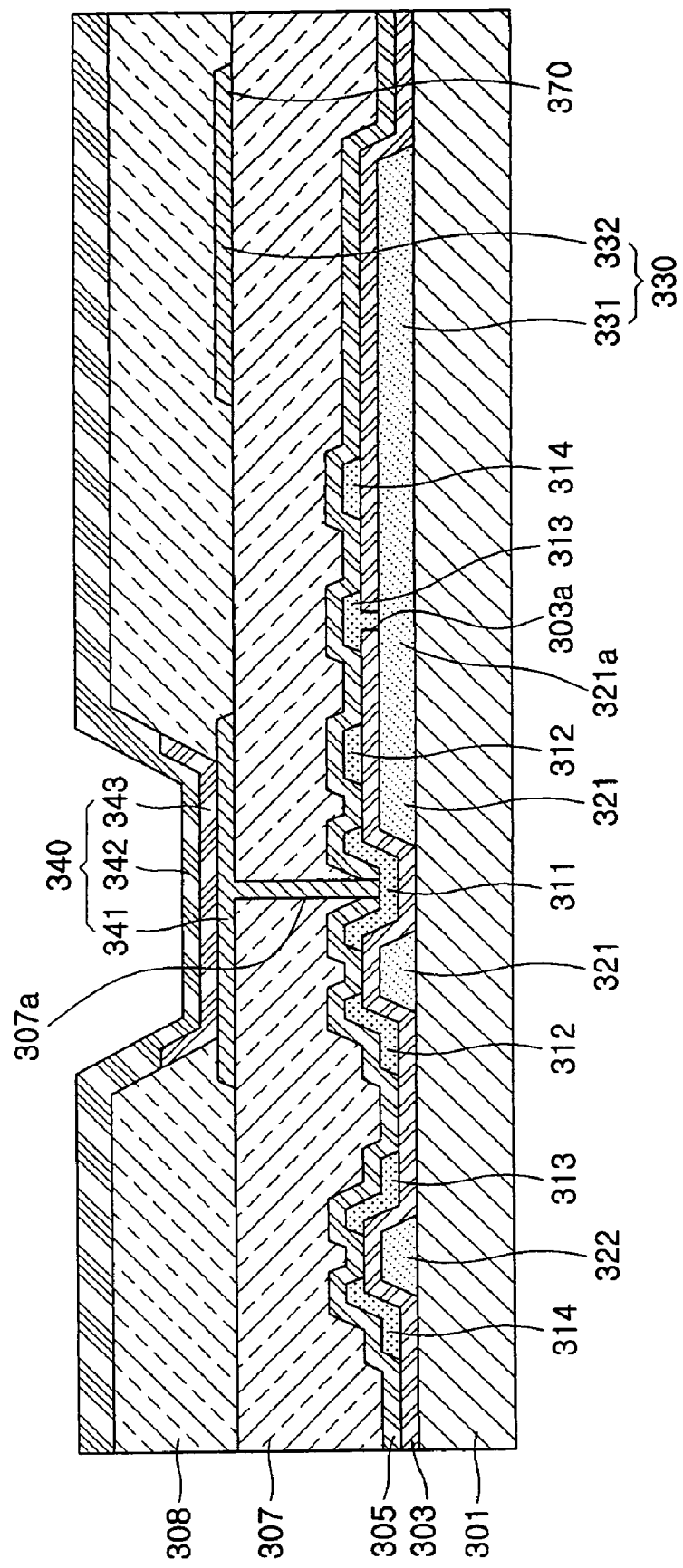
FIG. 8 is a cross-sectional view taken along line VIII—VIII of FIG. 7.

Turning now to FIGS. 6 through 8, FIG. 6 is a schematic circuit diagram of a subpixel unit of an electroluminescent display device according to another embodiment of the present invention, FIG. 7 is a schematic plane view of the subpixel unit of the electroluminescent display device shown in FIG. 6, and FIG. 8 is a cross-sectional view taken along line VIII—VIII of FIG. 7. Referring to FIGS. 6 through 8, a first electrode 311, a second electrode 312 that surrounds the first electrode 311 in the same plane, a third electrode 313 that surrounds the second electrode 312 in the same plane, and a fourth electrode 314 that surrounds the third electrode 313 in the same plane are formed on a substrate 301. A first gate electrode 321, that is insulated from the first through fourth electrodes 311, 312, 313, and 314 and located on a separate but parallel plane to the plane of first through fourth electrodes 311, 312, 313, and 314 to correspond to a space between the first electrode 311 and the second electrode 312, and a second gate electrode 322, which is insulated from the first through fourth electrodes 311, 312, 313, and 314 and located on a separate and parallel plane to the plane of the first through fourth electrodes 311, 312, 313, and 314 to correspond to a space between the third electrode 313 and the fourth electrode 314, are formed on the substrate 301. A semiconductor layer 305, which is insulated from the first gate electrode 321 and the second gate electrode 322 and contacts the first through fourth electrodes 311, 312, 313, and 314, is further formed on the substrate 301. The semiconductor layer 305 can be an organic semiconductor layer, as previously described.

In this embodiment, the first gate electrode 321 and the second gate electrode 322 can be formed in the same plane. In particular, the second gate electrode 322 can partially surround the first gate electrode 321, and a protrusion 321a that protrudes from the first gate electrode 321 through an opening of the second gate electrode 322 can be formed in the first gate electrode 321. Owing to the existence of the protrusion 321a, an external device can be easily connected to the first gate electrode 321 which the second gate electrode 322 surrounds. This will be described later.

The first through fourth electrode 311, 312, 313, and 314 are source electrodes and drain electrodes of TFTs. FIGS. 6 through 8 illustrate two TFTs. In other words, the first electrode 311, the second electrode 312, and the first gate electrode 321 are included in one TFT, and the third electrode 313, the fourth electrode 314, and the second gate electrode 322 are included in the other TFT. In each of the TFTs, one of a source electrode and a drain electrode surrounds the other electrode thereof, and simultaneously, a source electrode and a drain electrode of one TFT are surrounded by a source electrode and a drain electrode of the other TFT. In this embodiment, when one of the first electrode 311 and the second electrode 312 is a source electrode, the other electrode thereof is a drain electrode. In the present embodiment, which electrode is a source electrode and which electrode is a drain electrode will be described later.

A display element having a pixel electrode 341 connected to one of the first through fourth electrodes 311, 312, 313, and 314 is present. In particular, in the present embodiment, the pixel electrode 341 is connected to the first electrode 311. As shown in FIGS. 6 through 8, the display element is an electroluminescent element 340. The structure and operation of the electroluminescent element 340 will be described later.

As shown in FIG. 7, the electroluminescent element 340 has a structure where the pixel electrode 341 is not formed on the first through fourth electrodes 311, 312, 313, and 314, that is, a structure corresponding to a rear emission display device where light generated in the display element connected to the pixel electrode 341 is emitted through the substrate 301. However, the pixel electrode 341 can be formed above (further away from the substrate than) the first through fourth electrodes 311, 312, 313, and 314, and the electroluminescent display element 340 can be a rear emission display element, a front emission display element, or a double emission display element. FIG. 8 is a cross-sectional view illustrating the embodiment where the pixel electrode 341 is also formed above (i.e., further away from the substrate than) the first through fourth electrodes 311, 312, 313, and 314. This variation is applied to embodiments that will be described later.

In this embodiment, the flat panel display device includes a storage capacitor 330 that includes a first capacitor electrode 331 and a second capacitor electrode 332. The first capacitor electrode 331 is connected to the first gate electrode 321 and the third electrode 313, and the second capacitor electrode 332 is connected to the second electrode 312. A connecting structure and method thereof will be described later.

TFTs of the flat panel display device shown in FIGS. 6 through 8 are inverted coplanar TFTs, that is, TFTs where the first through fourth electrodes 311, 312, 313, and 314 and the semiconductor layer 305 are formed on the first gate electrode 321 and the second gate electrode 322 and in particular, the semiconductor layer 305 is formed on the first through fourth electrodes 311, 312, 313, and 314. In addition, a gate insulating layer 303 is further formed on the substrate 301 to cover the first gate electrode 321, the second gate electrode 322, and the first capacitor electrode 331, and a protective layer 307 is further formed on the substrate 301 to cover the first through fourth electrodes 311, 312, 313, and 314 and the semiconductor layer 305, and the second capacitor electrode 332 is formed on the protective layer 307.

In the above-described structure, the second gate electrode 322 partially surrounds the first gate electrode 321, and a protrusion 321*a* that protrudes from the first gate electrode 321 through an opening of the second gate electrode 322 is formed in the first gate electrode 321. Because of the protrusion 321*a*, an external device can be easily connected to the first gate electrode 321 that surrounds the second gate electrode 322. In particular, in the present embodiment, the protrusion 321*a* is connected to the first capacitor electrode 331. In this embodiment, the first gate electrode 321, the protrusion 321*a*, and the first capacitor electrode 331 can be formed as a single body. As described above, the third electrode 313 and the first capacitor electrode 331 are connected to each other via a contact hole 303*a* formed in the gate insulating layer 303.

The second capacitor electrode 332 can be formed on the protective layer 307 and is connected to the second electrode 312 via a contact hole 307*b* formed in the protective layer 307. In addition, the pixel electrode 341 connected to the first electrode 311 via a contact hole 307*a* formed in the protective layer 307 can be formed on the protective layer 307. In this embodiment, the pixel electrode 341 and the second capacitor electrode 332 can be simultaneously formed of the same material.

The second gate electrode 322 is connected to a first conducting line 350 and thus can be formed with the first conducting line 350 as a single body, and the fourth electrode 314 is connected to a second conducting line 360 and thus can be formed with the second conducting line 360 as a single body. In addition, the second capacitor electrode 332 is connected to a third conducting line 370 and thus can be formed with the third conducting line 370 as a single body.

The correlation between the structures of the two TFTs will be described with reference to FIGS. 6 through 8. The first electrode 311, the second electrode 312, and the first gate electrode 321 are included in one TFT, and the third electrode 313, the fourth electrode 314, and the second gate electrode 322 are included in the other TFT. In the flat panel display device according to the present embodiment, a former driving transistor is a switching transistor, and a latter TFT is a switching transistor. The flat panel display device according to the present embodiment and embodiments that will be described later is a flat panel display device having two TFTs and one storage capacitor, as described above. The flat panel display device can be a flat panel display device having other elements, and this variation is applied to embodiments that will be described later.

In a connecting structure of the switching transistors, the second gate electrode 322 is connected to a driving circuit (not shown) by the first conducting line 350, the fourth electrode 314 is connected to the driving circuit by the second conducting line 360, and the third electrode 313 is connected to a gate electrode, that is, the first gate electrode 321, and the first capacitor electrode 331 of the driving transistor via the contact hole 303*a* formed in the gate insulating layer 303. In the above structure, the fourth electrode 314 can be a source electrode of the switching transistor, and the third electrode 313 can be a drain electrode of the switching transistor. In addition, the first conducting line 350 can is a scan line, and the second conducting line 360 is a data line.

In a connecting structure of the driving transistors, the second capacitor electrode 332 of the storage capacitor 330 and the second electrode 312 are connected to the third conducting line 370, and the first electrode 311 is connected to the pixel electrode 341 of the electroluminescent display element 340. In the above structure, the second electrode 312 can be a source electrode of the driving transistor, the first electrode 311 can be a drain electrode of the driving transistor, and the third conducting line 370 can be a power supplying line.

In the active matrix electroluminescent display device having the above-described structure, a plurality of TFTs such as a driving transistor and a switching transistor are used in each subpixel. Thus, when cross-talk occurs in these TFTs, the amount of light generated in the electroluminescent display element 340 is not properly controlled and therefore, a proper image cannot be produced. Thus, in the embodiment of using the TFT where one of the source electrode and the drain electrode surrounds the other electrode thereof in the same plane, cross-talk can be prevented from occurring without patterning the semiconductor layer such that a more clear and precise image can be produced.

In addition, in this embodiment, each TFT has a structure where one of a source electrode and a drain electrode surrounds the other electrode thereof and simultaneously, a source electrode and a drain electrode of one TFT are surrounded by a source electrode and a drain electrode of the other TFT, such that the area of the TFTs can be greatly reduced. Thus, in the embodiment of a rear emission display device where light is emitted toward the substrate 301, a flat panel display device having a larger opening ratio can be manufactured. The TFTs having the above structure can be used even in a front emission display device where light is emitted in a direction opposite to the substrate 301, or a double emission display device where light is emitted both toward the substrate 301 and in a direction opposite to the substrate 301, such that a display device with higher resolution can be manufactured.

In a flat panel display device including a TFT having the above structure and a display element connected to and driven by the TFT, the display element can be an electroluminescent element or a liquid crystal display element. As described above, in the flat panel display device according to the present invention, the electroluminescent element 340 is used as the display element. Thus, the structure of the electroluminescent element 340 will now be briefly described.

The electroluminescent display device includes a plurality of pixels including subpixels emitting red, green, and blue, from an emission layer. Each subpixel producing red, green, and blue colors includes an electroluminescent display element, which is a self-emission element, and at least one or more thin film transistors (TFTs) connected to the electroluminescent element. As described above, the TFTs can be TFTs where one of a source electrode and a drain electrode surrounds the other electrode thereof in the same plane. In this embodiment, the TFTs are connected to the electroluminescent element in the above-described shape.

The electroluminescent element is a light-emitting element driven by a current and emits red, green or blue light according to the flow of current between two electrodes included in the emission device, thereby forming a predetermined image. The structure of the electroluminescent element will now be briefly described. As described above, the electroluminescent element includes a pixel electrode 341 connected to the first electrode 311, an opposite electrode 342 formed to cover all pixels or to correspond to each pixel, and an intermediate layer 343 including at least an emission layer located between the pixel electrode 341 and the opposite electrode 342. The present invention is not limited to the above-described structure but can have a variety of structures.

The pixel electrode 341 serves as an anode electrode, and the opposite electrode 342 serves as a cathode electrode. Here, the pixel electrode 341 and the opposite electrode 342 can have opposite polarities.

The pixel electrode 341 can be a transparent electrode or a reflection electrode. When the pixel electrode 341 is a transparent electrode, the pixel electrode 341 can be formed of ITO, IZO, ZnO or $In_2O_3$. When the pixel electrode 341 is a reflection electrode, after a reflection layer is formed of Ag, Mg, Al, Pt, Pd, Au, Ni, Nd, Ir, Cr or a compound thereof, the pixel electrode 341 can be formed of ITO, IZO, ZnO or $In_2O_3$ on the reflection layer.

The opposite electrode 342 can also be a transparent electrode or a reflection electrode. When the opposite electrode 342 is a transparent electrode, Li, Ca, LiF/Ca, LiF/Al, Al, Ag, Mg or a compound thereof is deposited toward the intermediate layer, an auxiliary electrode layer or a bus electrode line can be formed of a material used in forming the transparent electrode, such as ITO, IZO, ZnO or $In_2O_3$, on a deposited resultant. When the opposite electrode 342 is a reflection electrode, the opposite electrode 342 is formed by depositing Li, Ca, LiF/Ca, LiF/Al, Al, Mg or a compound thereof on the entire surface of the electroluminescent display element. However, the present invention is not limited to this and the pixel electrode 341 and the opposite electrode 342 can be formed of an organic material such as conductive polymer etc.

The electroluminescent element is classified into an inorganic electroluminescent element and an organic electroluminescent element depending on whether the intermediate layer 343 is an inorganic layer or an organic layer. In the latter embodiment, the intermediate layer 343 can be a low molecular organic film or a high molecular organic film.

When the intermediate layer 343 is a low molecular organic film, the intermediate layer 343 can be formed by depositing a hole injection layer (HIL), a hole transport layer (HTL), an emission layer (EML), an electron transport layer (ETL), or an electron injection layer (EIL) with a single or composite structure. The intermediate layer 343 can be formed of an organic material such as copper phthalocyanine (CuPc), N,N'-Di(naphthalene-1-yl)-N,N'-diphenyl-benzidine (NPB) or tris-8-hydroxyquinoline aluminum (Alq3) or the like. The low molecular organic film can be formed by heating an organic substance in a vacuum state and depositing the organic substance. The structure of the intermediate layer 343 is not limited to this and the intermediate layer 343 can be a variety of layers.

When the intermediate layer 343 is a high molecular organic film, the intermediate layer 343 can be usually a HTL and an EML. A high molecular HTL can be formed by ink-jet printing or spin coating using poly-(2,4)-ethylenedihydroxy thiophene (PEDOT) or polyaniline (PANI), or the like. A high molecular EML can be formed of PPV, soluble PPV's, cyano-PPV or polyfluorene etc. A color pattern of the EML can be formed using general methods such as ink-jet printing or spin 11 coating or thermal transfer using laser. In the embodiment of the high molecular organic film, the structure of the intermediate layer 343 is not limited to this and the intermediate layer 343 can be a variety of layers as necessary.

In the embodiment of the inorganic electroluminescent element, the intermediate layer 343 can be an inorganic film and includes an emission layer and an insulating layer interposed between the emission layer and an electrode. The structure of the intermediate layer 343 is not limited to this and the intermediate layer 343 can be a variety of layers as necessary.

The emission layer can be formed of a metallic sulfide such as ZnS, SrS or CaS, an alkali-earth potassium sulfide such as $CaGa_2S_4$ or $SrGa_2S_4$, and emission central atoms such as transition metal including Mn, Ce, Th, Eu, Tm, Er, Pr, and Pb etc. or alkali-rare earth metals.

In the electroluminescent element having the above-described structure, as described above, one electrode of a TFT where one of a source electrode and a drain electrode surrounds the other electrode thereof in the same plane, is connected to a pixel electrode 341 of the electroluminescent element such that a flow of current to the pixel electrode is controlled and emission of each pixel is controlled.

The flat panel display device according to the present embodiment is a flat panel display device including the electroluminescent element having the above structure as the display element. However, the present invention can be applied to a display element connected to a TFT having the above-described structure, and this variation is applied to embodiments that will be described later. For explanatory conveniences, the embodiment where the electroluminescent element is used as the display element connected to the TFT will be described in subsequent embodiments.

In addition, the TFT is an inverted coplanar TFT where a gate insulating layer is formed on a gate electrode to cover the gate electrode, a source electrode and a drain electrode are formed on the gate insulating layer and a semiconductor layer is formed on the source electrode and the drain electrode to cover the source electrode and the drain electrode. However, the present invention can be applied to a TFT having a variety of shapes including an inverted staggered TFT, and this variation is applied to embodiments that will be described later.

Figure 9:
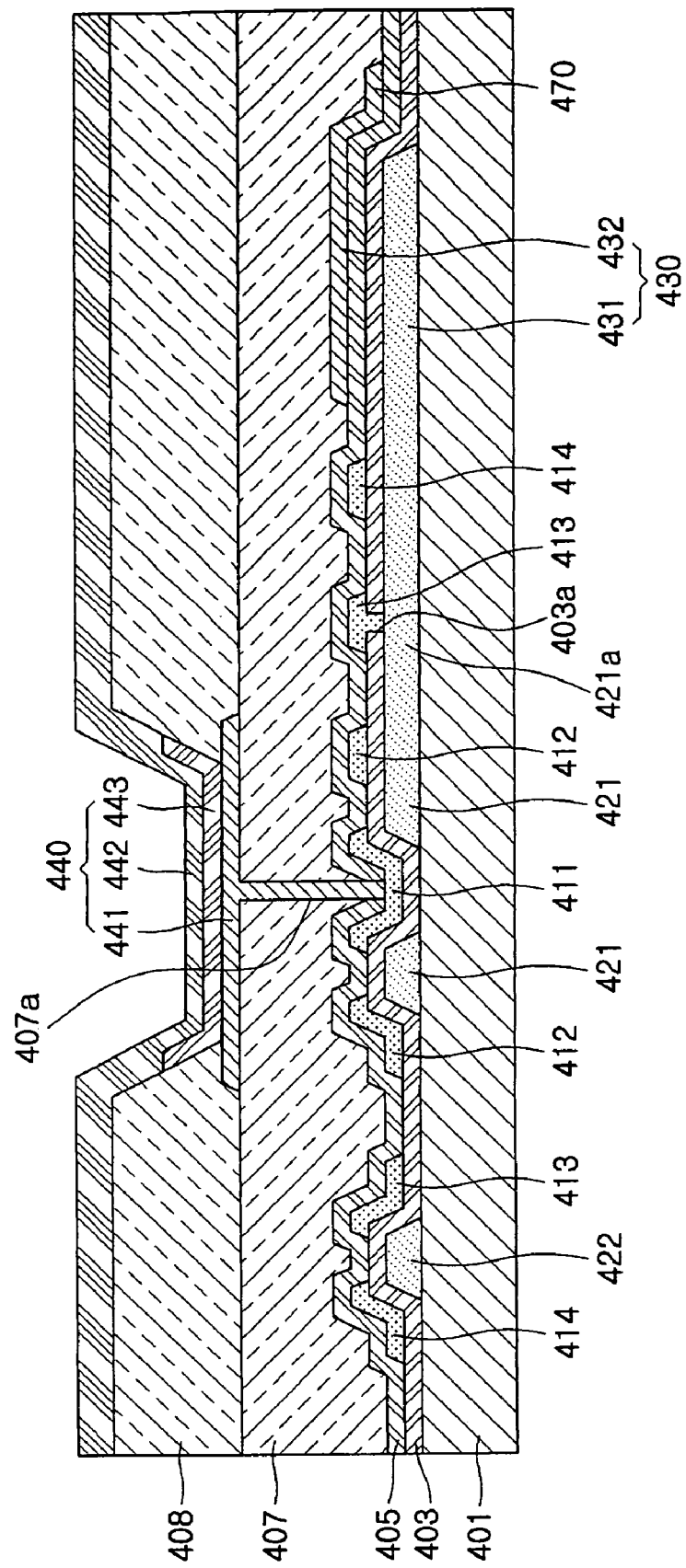
FIG. 9 is a schematic cross-sectional view of an electroluminescent display device according to another embodiment of the present invention.

FIG. 9 is a schematic cross-sectional view of an electroluminescent display device according to another embodiment of the present invention. The electroluminescent display device shown in FIG. 9 is different from the electroluminescent display device shown in FIG. 8 in that the position of a second capacitor electrode 432 of a storage capacitor 430 is that of the electroluminescent display device shown in FIG. 8.

The second capacitor electrode 332 of the electroluminescent display device shown in FIG. 8 is formed on the protective layer 307. In FIG. 8, the second capacitor electrode 332 can also be formed of the same material as a material used in forming the pixel electrode 341 formed on the protective layer 307. However, in the display device, the larger the electrostatic capacity of the storage capacitor 330, the better the display device. To this end, the area of the first capacitor electrode 331 and the second capacitor electrode 332 included in the storage capacitor 330 should be increased, or a distance between the first capacitor electrode 331 and the second capacitor electrode 332 should be made narrow. However, in the former embodiment of FIG. 8, the area of an emission region in the area of each subpixel is reduced.

In the electroluminescent display device according to the present embodiment of FIG. 9, a second capacitor electrode 432 is formed not on a protective layer 407 but on a semiconductor layer 405 such that a distance between electrodes 431 and 432 of the storage capacitor 430 can be reduced and the electrostatic capacity of the storage capacitor 430 can be increased.

Figure 10:
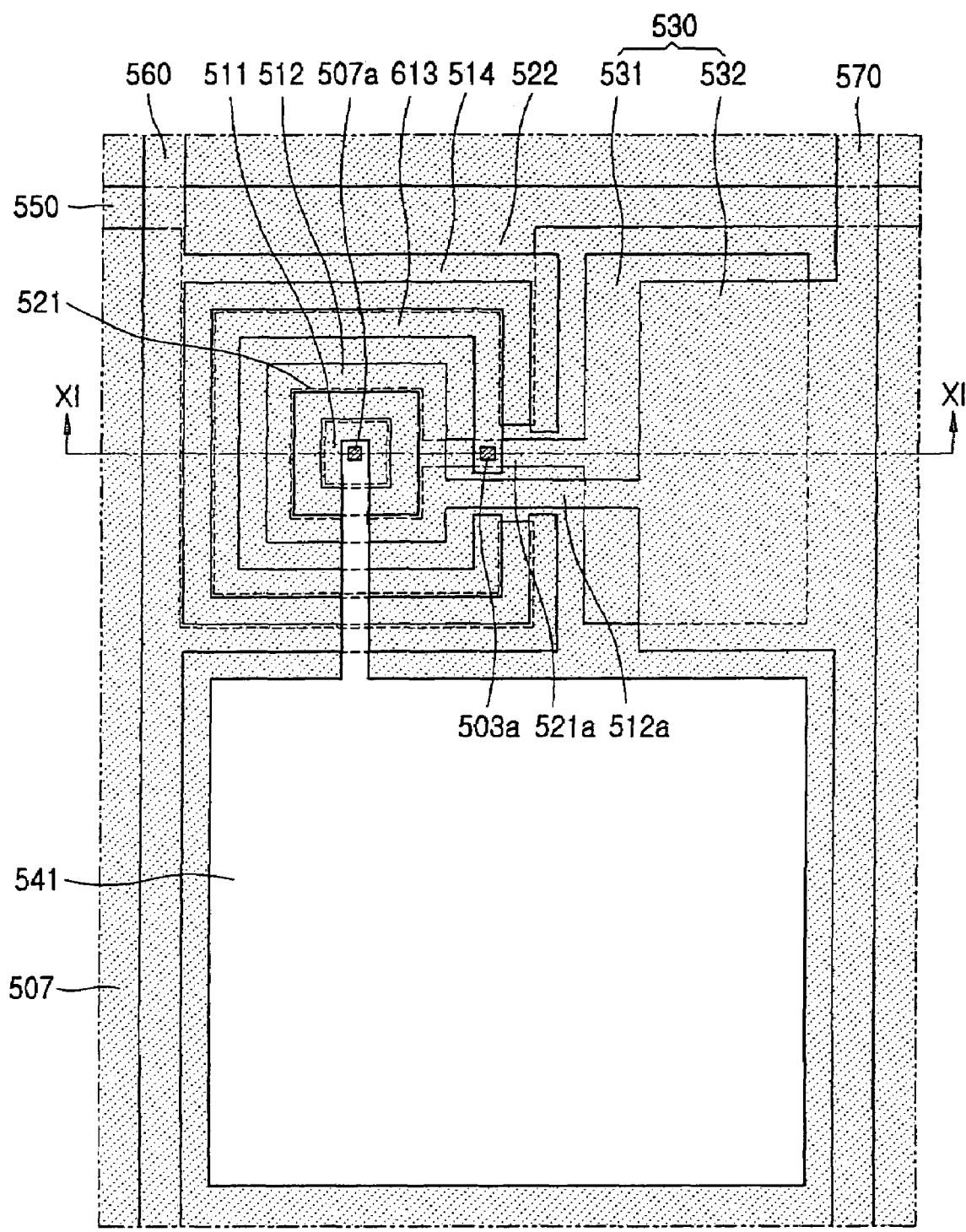
FIG. 10 is a schematic plane view of a subpixel unit of an electroluminescent display device according to another embodiment of the present invention.
Figure 11:
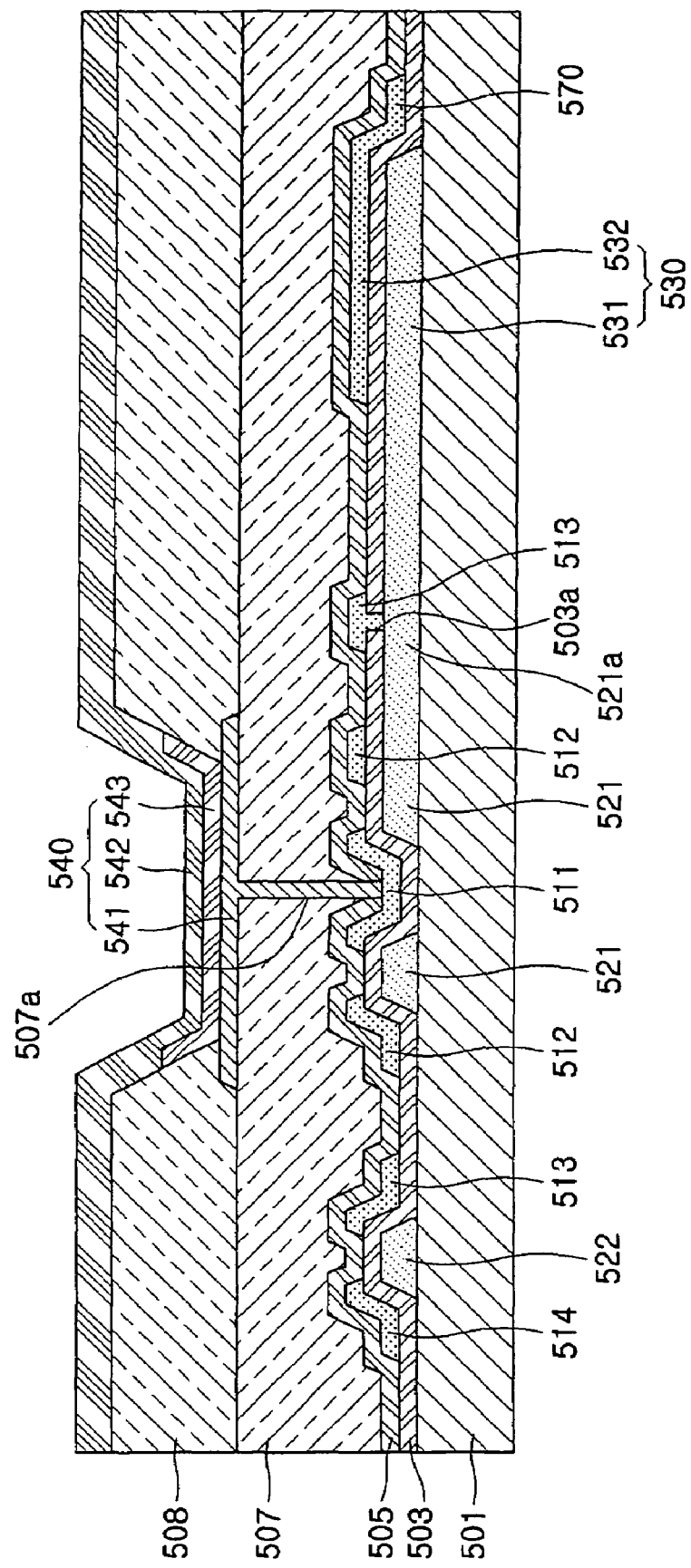
FIG. 11 is a cross-sectional view taken along line XI—XI of FIG. 10.

FIG. 10 is a schematic circuit diagram of a subpixel unit of an electroluminescent display device according to another embodiment of the present invention, and FIG. 11 is a cross-sectional view taken along line XI—XI of FIG. 10. The electroluminescent display device shown in FIG. 10 is different from the electroluminescent display devices shown in FIGS. 8 and 9 in that the structure of a third electrode 513 and a fourth electrode 514, a connecting structure of a second electrode 512 and a second capacitor electrode 532, and the position of a second capacitor electrode 532 are different from those of the electroluminescent display devices shown in FIGS. 8 and 9.

In other words, in the electroluminescent display devices shown in FIGS. 8 and 9, when connecting the third electrodes 313 and 413 and the second capacitor electrodes 332 and 432 to one another, the second capacitor electrodes 332 and 432 are formed on a plane where the third electrodes 313 and 413 are formed, and the contact hole 307b (not shown in FIG. 9) is formed in the third electrodes 313 and 413 so that the third electrodes 313 and 413 and the second capacitor electrodes 332 and 432 are connected to one another via the contact hole 307b.

Referring to FIGS. 10 and 11, in the electroluminescent display device according to the present embodiment, the third electrode 513 partially surrounds the second electrode 512 in the same plane, the fourth electrode 514 partially surrounds the third electrode 513 in the same plane, a protrusion 512a that protrudes from the second electrode 512 through an opening of the third electrode 513 and an opening of the fourth electrode 514 is formed in the second electrode 512, and the protrusion 512a is connected to the second capacitor electrode 532.

Thus, the first through fourth electrodes 511, 512, 513, and 514 are formed on a gate insulating layer 503, a semiconductor layer 505 is formed to cover the first through fourth electrodes 511, 512, 513, and 514, and the second capacitor electrode 532 is formed on the gate insulating layer 503. In this embodiment, the second electrode 512, the protrusion 512a formed in the second electrode 512, and the second capacitor electrode 532 can be formed as a single body.

With the above structure, the electroluminescent display device can be manufactured using fewer contact holes than in the electroluminescent display devices shown in FIGS. 8 and 9, such that a defect rate in the manufacture of the electroluminescent display device can be reduced. In addition, a distance between electrodes of a storage capacitor 530 is made narrow such that the electrostatic capacity of the storage capacitor 530 is increased.

In this embodiment, even in TFTs having the above-described structure, like in TFTs having a structure where one electrode surrounds another electrode in the same plane or completely, cross-talk between adjacent TFTs due to a leakage current etc. can be prevented from occurring. With the TFTs having the above structure, the area of the TFTs can be greatly reduced. Thus, as described above, in the embodiment of the back-side emission display device, a flat panel display device having a larger numerical aperture (NA) can be manufactured, and even in the embodiment of the front emission display device or the double emission display device, a display device with higher resolution can be manufactured by using the TFTs having the above structure.

Figure 12:
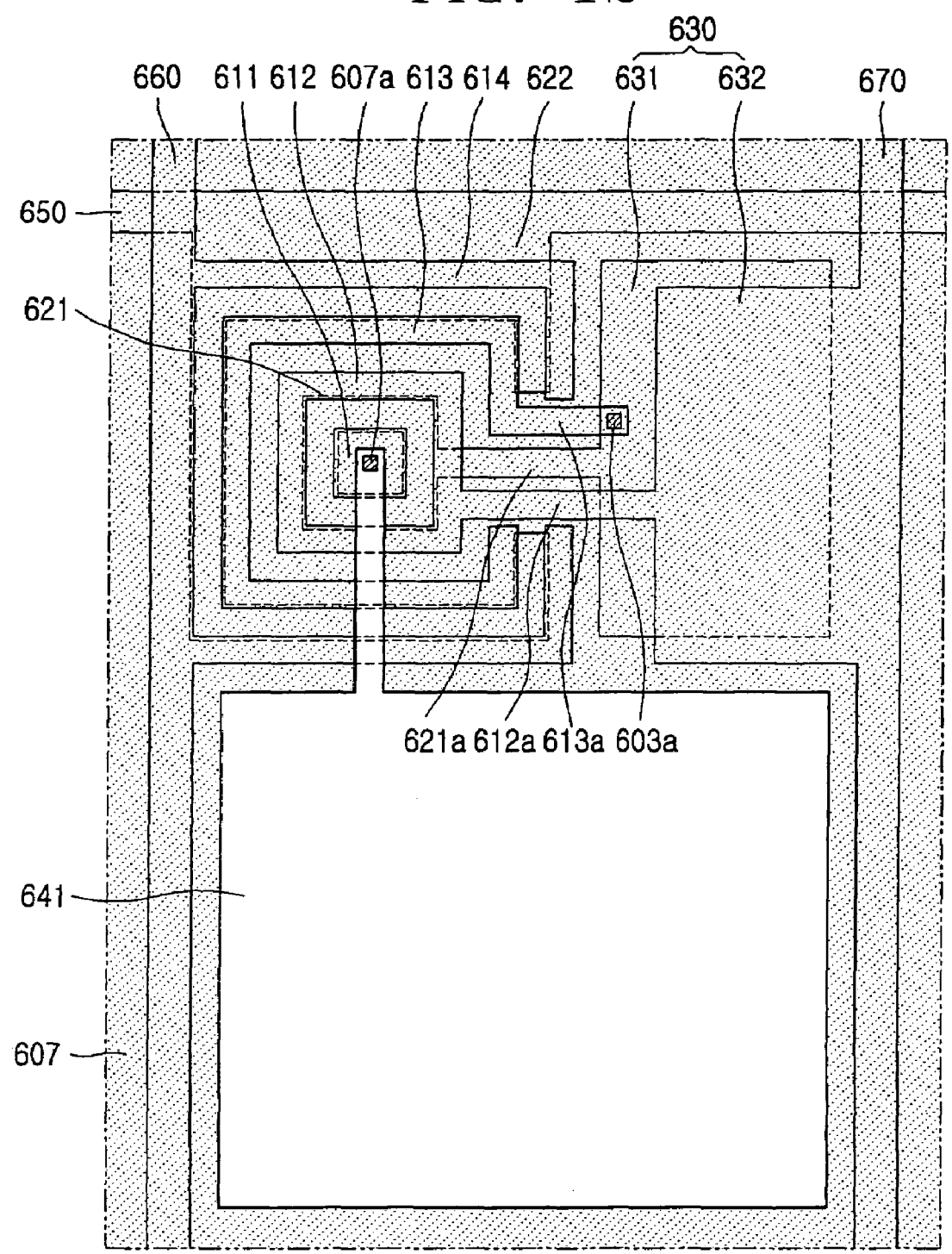
FIG. 12 is a schematic plane view of a subpixel unit of an electroluminescent display device according to another embodiment of the present invention.

FIG. 12 is schematic plane view of a subpixel unit of an electroluminescent display device according to another embodiment of the present invention. The electroluminescent display device shown in FIG. 12 is different from the electroluminescent display device shown in FIG. 10 in that a connecting structure of the third electrode 613 and a first capacitor electrode 631 is different from that of the electroluminescent display device shown in FIG. 10.

In the electroluminescent display device shown in FIG. 12, a connecting structure of first gate electrodes 521 and 621 and first capacitor electrodes 531 and 631 is the same as that of the electroluminescent display device shown in FIG. 10. In other words, the second gate electrodes 522 and 622 partially surround the first gate electrodes 521 and 621 in the same plane, protrusions 521a and 621a that protrude from the first gate electrode 521 through an opening of each of the second gate electrodes 522 and 622 are formed in the first gate electrodes 521 and 621, and the protrusions 521a and 621a and the first capacitor electrodes 531 and 631 are connected to one another. In this embodiment, the first gate electrodes 521 and 621, the protrusions 521a and 621a, and the first capacitor electrodes 531 and 631 can be formed as a single body.

In this embodiment, in the electroluminescent display device shown in FIG. 10, a contact hole 503a is formed on the protrusion 521a formed in the first gate electrode 521, and the third electrode 513 is connected to the first gate electrode 521 and the first capacitor electrode 531 via the contact hole 503a.

However, in the electroluminescent display device according to the present embodiment, since a fourth electrode 614 partially surrounds a third electrode 613 in the same plane, a protrusion 613a that protrudes from an opening of the fourth electrode 614 is also formed in the third electrode 613, the protrusion 613a is connected to the first capacitor electrode 631 via the contact hole 603a formed on the first capacitor electrode 631, such that the third electrode 613 is connected to the first capacitor electrode 631 and the first gate electrode 621 is formed as a single body with the first capacitor electrode 631. With the above structure, the third electrode 613 can be more securely connected to the first capacitor electrode 631 and the first gate electrode 621 formed as a single body with the first capacitor electrode 631.

Figure 13:
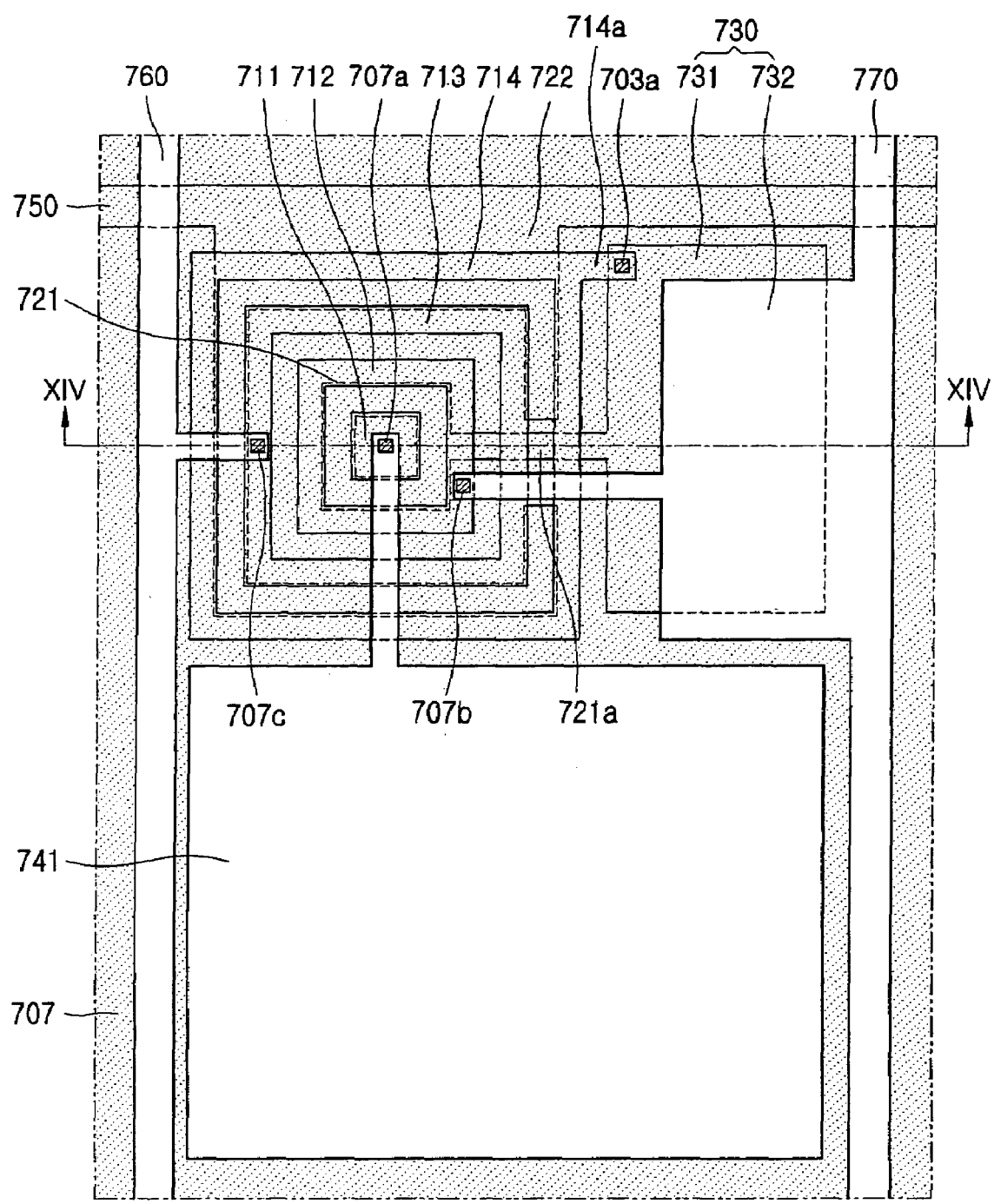
FIG. 13 is a schematic plane view of a subpixel unit of an electroluminescent display device according to another embodiment of the present invention.
Figure 14:
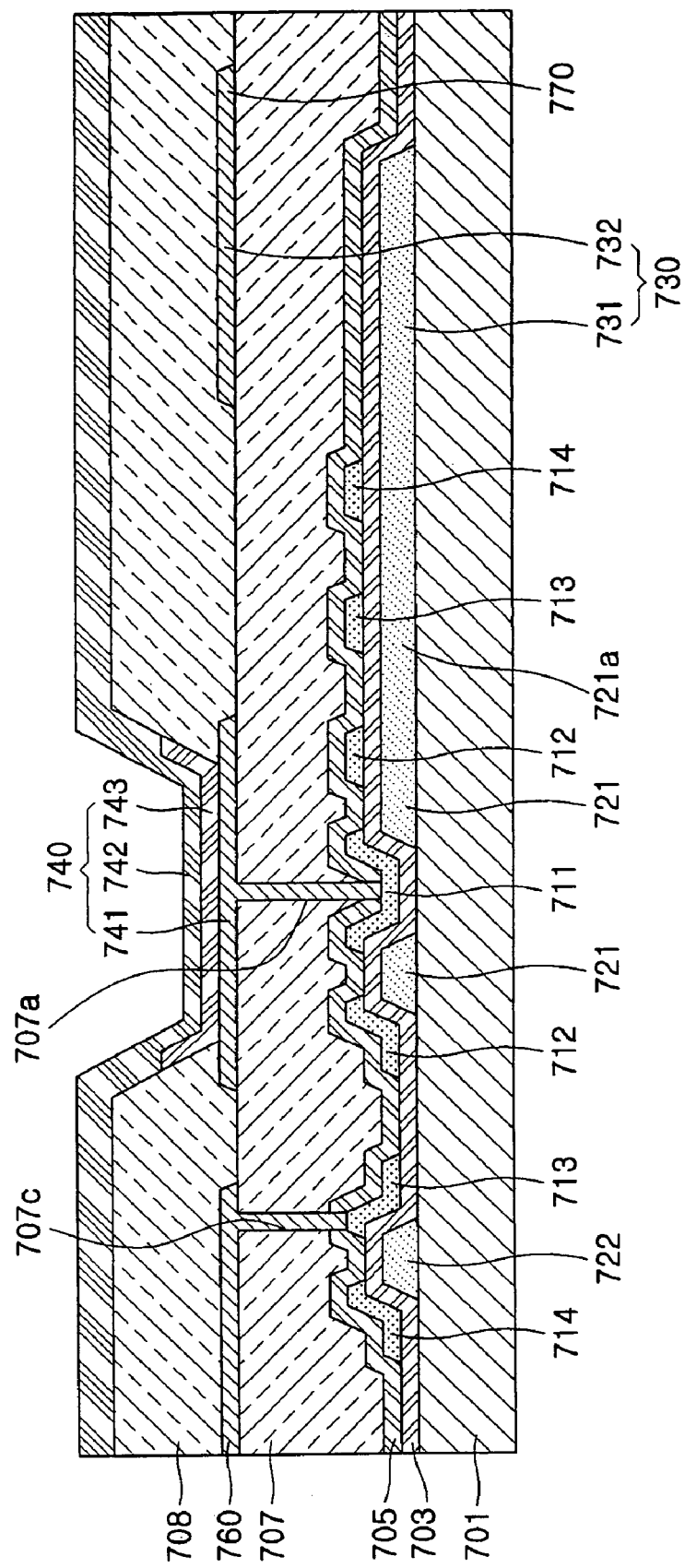
FIG. 14 is a cross-sectional view taken along line XIV—XIV of FIG. 13.

FIG. 13 is a schematic plane view of a subpixel unit of an electroluminescent display device according to another embodiment of the present invention, and FIG. 14 is a cross-sectional view taken along line XIV—XIV of FIG. 13. In the electroluminescent display device according to the present embodiment, like in the electroluminescent display devices according to the above-described embodiments, a first electrode 711, a second electrode 712, and a first gate electrode 721 are included in a driving transistor, and a third electrode 713, a fourth electrode 714, and a second gate electrode 722 are included in a switching transistor. In addition, in the driving transistor, the second electrode 712 is a source electrode of the driving transistor and is connected to a second capacitor electrode 732, and the first electrode 711 is a drain electrode of the driving transistor and is connected to a pixel electrode 741 of the electroluminescent display device.

However, in the switching transistor of the electroluminescent display device according to the above-described embodiments, an external electrode is a source electrode of the switching transistor, and an internal electrode is a drain electrode of the switching transistor. However, the switching transistor of the electroluminescent display device according to the present embodiment different from this. In other words, the third electrode 713 is a source electrode of the switching transistor and is connected to a second conducting line 760, the fourth electrode 714 is a drain electrode of the switching transistor and is connected to the first capacitor electrode 731.

In this embodiment, a contact hole 707c is formed on the third electrode 713 and is connected to the second conducting line 760. A protrusion 714a that protrudes in a direction of the first capacitor electrode 731 is formed in the fourth electrode 714, and the protrusion 714a is connected to the first capacitor electrode 731 via a contact hole 703a formed on the first capacitor electrode 731, such that the fourth electrode 714 and the first capacitor electrode 731 are connected to each other.

Figure 15:
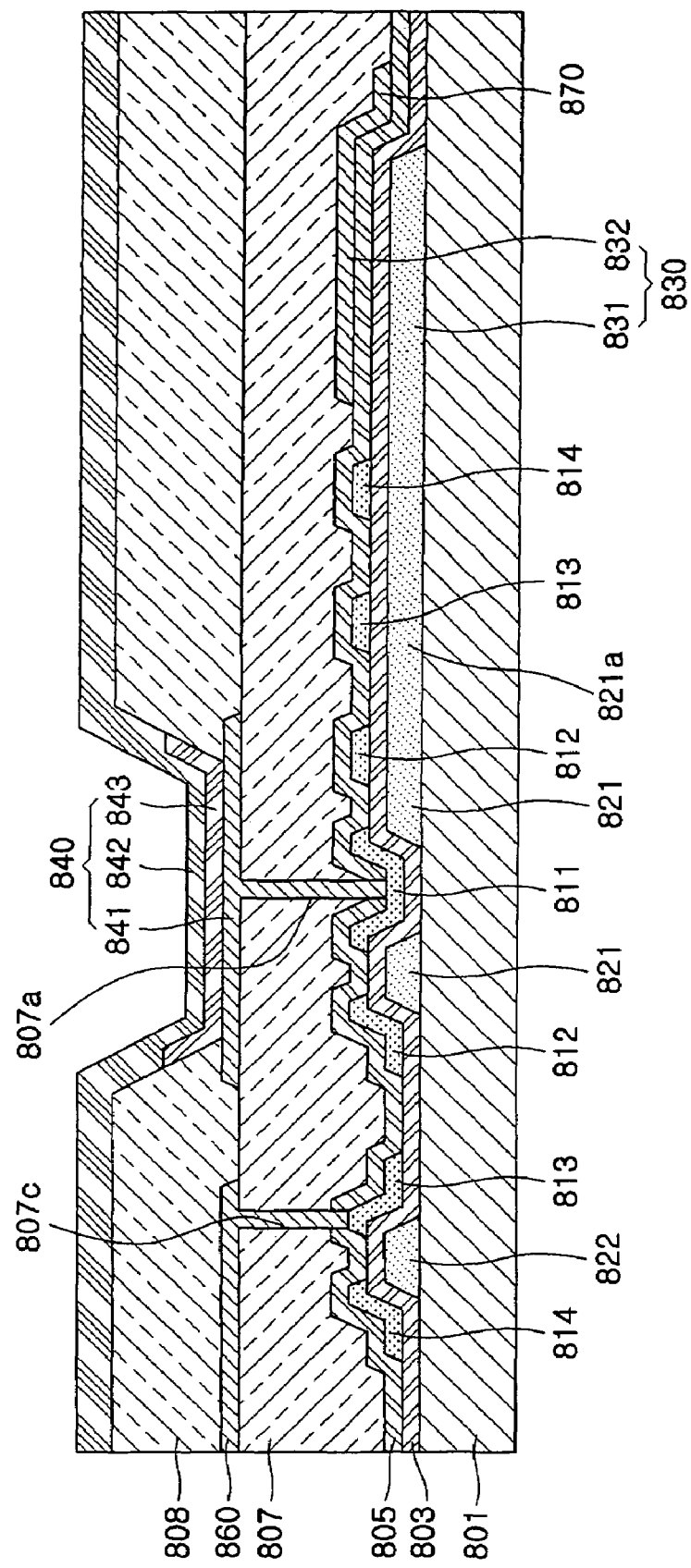
FIG. 15 is a schematic cross-sectional view of an electroluminescent display device according to another embodiment of the present invention.

Referring to FIG. 14, the second conducting line 760, the pixel electrode 741, and the second capacitor electrode 732 are formed on a protective layer 707 and can be simultaneously formed of the same material. With the above structure, the third electrode 713 can be a source electrode of the switching transistor, and the fourth electrode 714 can be a drain electrode of the switching transistor. FIG. 15 is a schematic cross-sectional view of an electroluminescent display device according to another embodiment of the present invention. As described above, it is good to increase the electrostatic capacity of a storage capacitor of the electroluminescent display device. Thus, one of methods of increasing the electrostatic capacity of the storage capacitor is to reduce a distance between electrodes of the storage capacitor. Referring to FIG. 15, the electroluminescent display device shown in FIG. 15 is different from the electroluminescent display device shown in FIG. 13 in that a second capacitor electrode 832 is formed not on a protective layer 807 but on a semiconductor layer 805. By doing so, the electrostatic capacity of the storage capacitor 830 can be increased.

Figure 16:
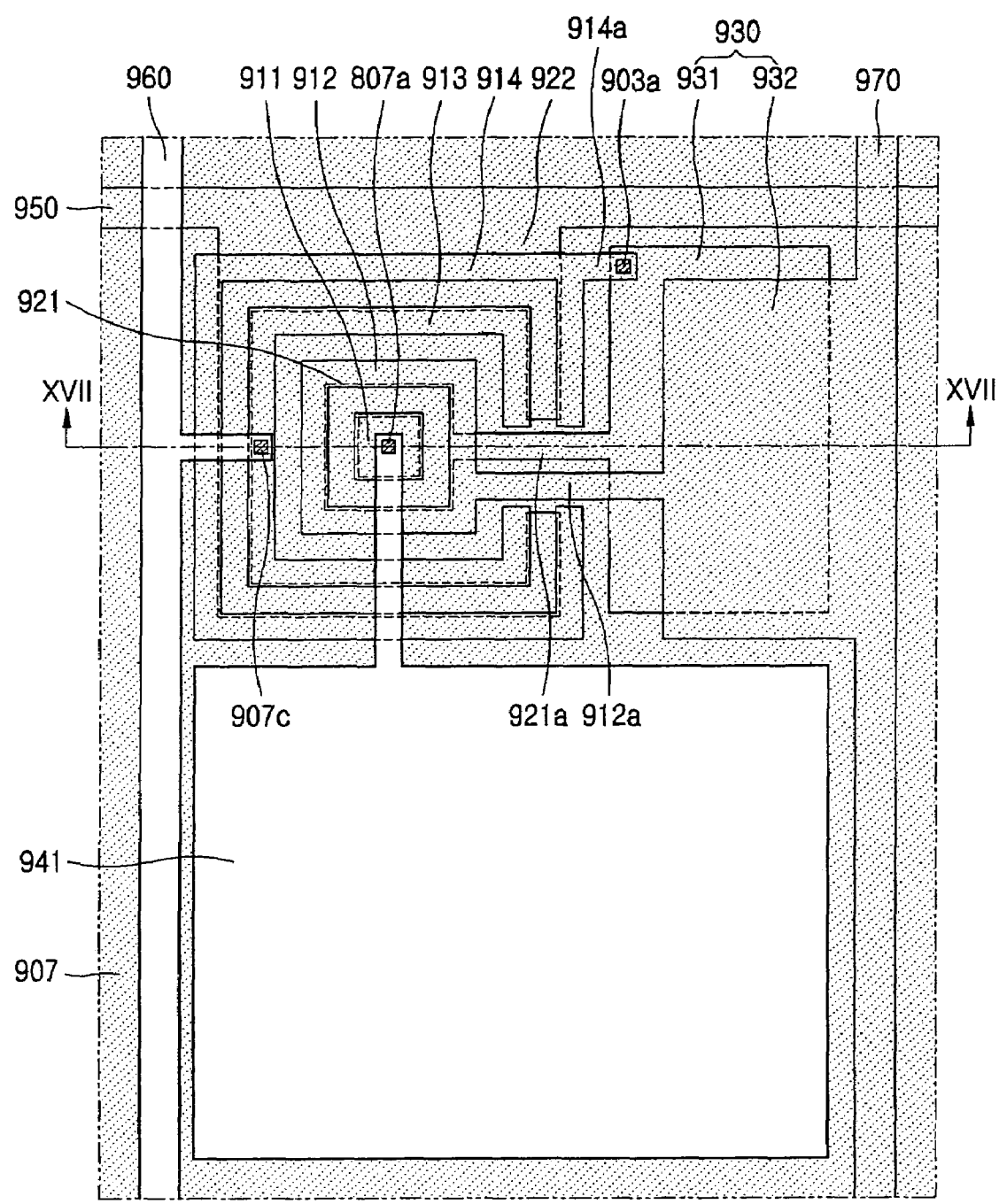
FIG. 16 is a schematic plane view of a subpixel unit of an electroluminescent display device according to another embodiment of the present invention.
Figure 17:
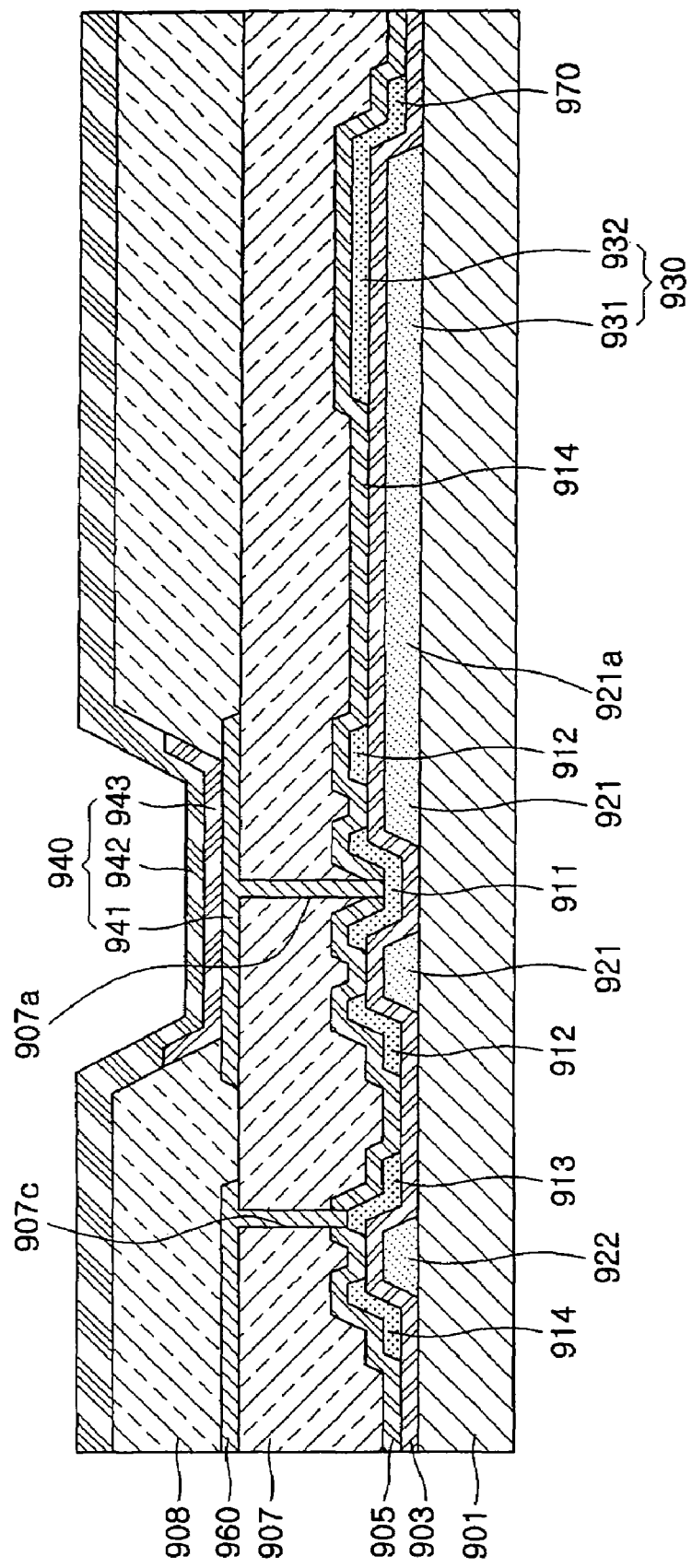
FIG. 17 is a cross-sectional view taken along line XVII—XVII of FIG. 16.

FIG. 16 is a schematic plane view of a subpixel unit of the electroluminescent display device according to another embodiment of the present invention, and FIG. 17 is a cross-sectional view taken along line XVII—XVII of FIG. 16. In the electroluminescent display device according to the present embodiment, like in the electroluminescent display devices shown in FIGS. 13 and 15, a source electrode of a switching transistor, that is, a third electrode 913, and a drain electrode of the switching transistor, that is, a fourth electrode 914, surround a source electrode of a driving transistor, that is, a second electrode 912, and a drain electrode of the driving transistor, that is, a first electrode 911, and the drain electrode of the switching transistor, that is, the fourth electrode 914 surrounds the source electrode of the switching transistor, that is, the third electrode 913.

In the above structure, the electroluminescent display device according to the present embodiment is different from the electroluminescent display devices shown in FIGS. 13 and 15 in that the source electrode of the driving transistor, that is, the second electrode 912, is connected to a second capacitor electrode 932.

In the electroluminescent display devices shown in FIGS. 14 and 15, the second capacitor electrodes 732 and 832 are formed on the protective layer 707 or on the semiconductor layer 805 and are connected to the second electrodes 712 and 812 via a contact hole 707b formed on the protective layer 707 or on the semiconductor layers 705 and 805.

However, in the electroluminescent display device according to the present embodiment, the third electrode 913 partially surrounds the second electrode 912 in the same plane, the fourth electrode 914 surrounds the third electrode 913 in the same plane to expose a portion of the third electrode 913, a protrusion 912a that protrudes from an opening of the third electrode 913 and an opening of the fourth electrode 914 is formed in the second electrode 912, and the protrusion 912a is connected to the second capacitor electrode 932, such that the second electrode 912 and the second capacitor electrode 932 are connected to each other. In this embodiment, the second electrode 912, the protrusion 912a formed in the second electrode 912, and the second capacitor electrode 932 can be formed in the same plane, that is, on a gate insulating layer 903 and can be simultaneously formed of the same material.

With the above structure, the electroluminescent display device can be manufactured using fewer contact holes than in the electroluminescent display devices shown in FIGS. 13 and 15, such that a defect rate in the manufacture of the electroluminescent display device can be reduced. In addition, a distance between electrodes of a storage capacitor 930 is made to be smaller so that the electrostatic capacity of the storage capacitor 930 is increased.

Figure 18:
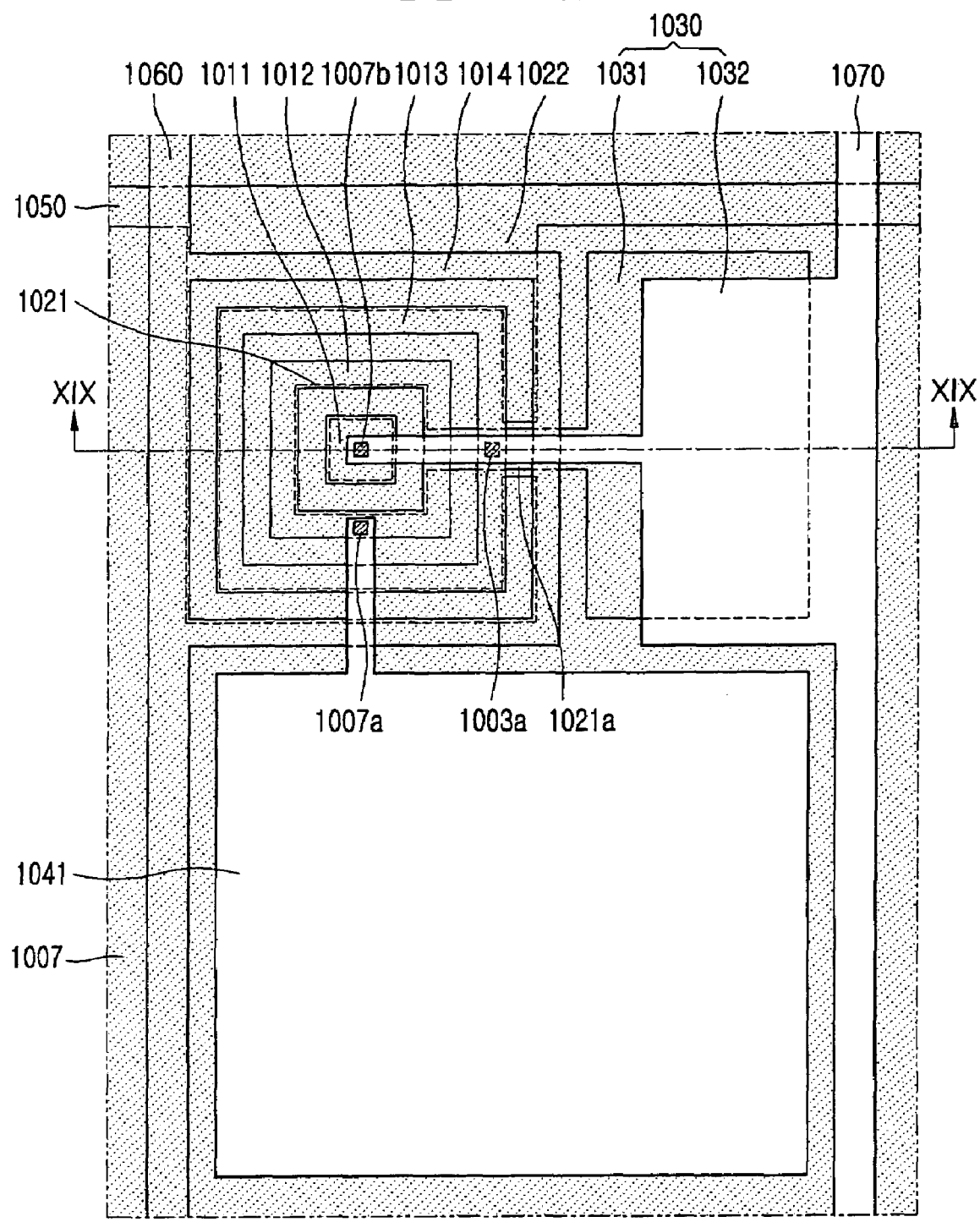
FIG. 18 is a schematic plane view of a subpixel unit of an electroluminescent display device according to another embodiment of the present invention.
Figure 19:
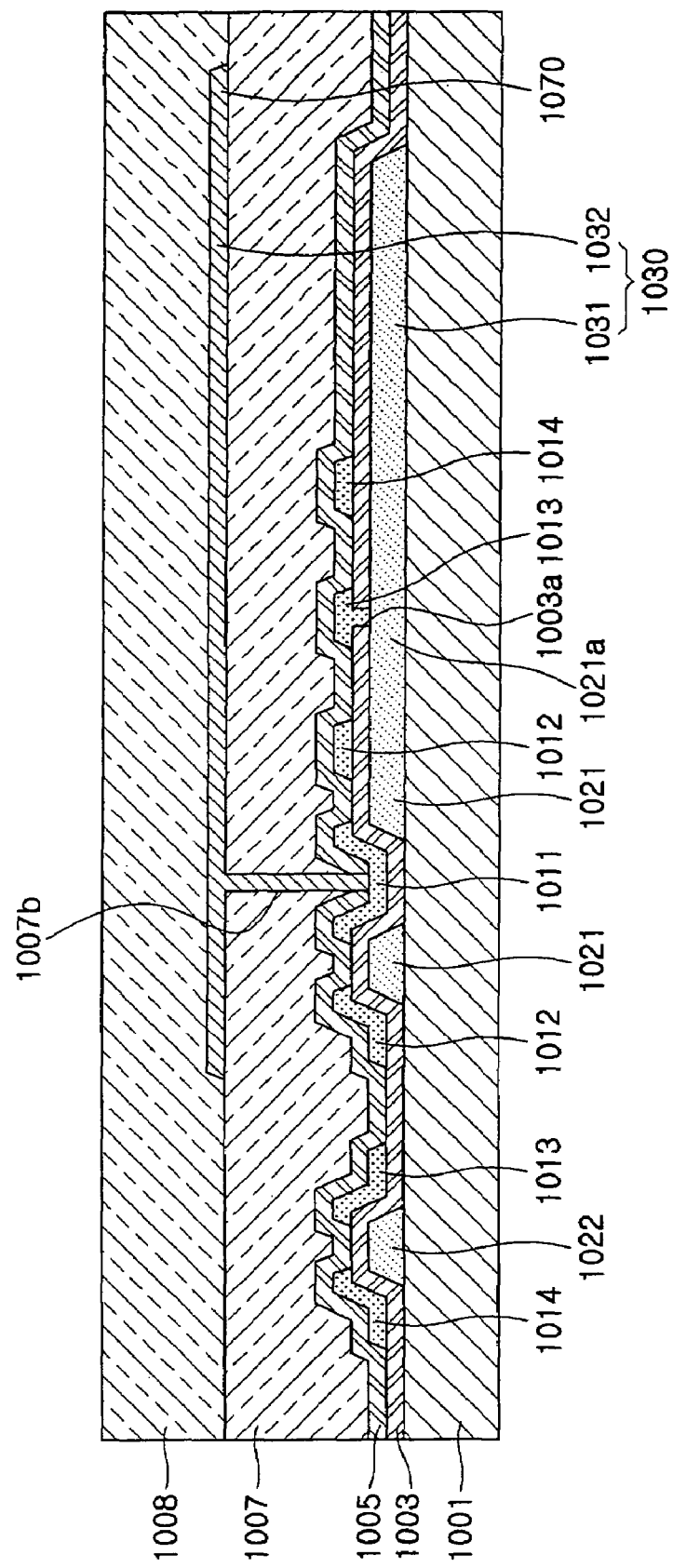
FIG. 19 is a cross-sectional view taken along line XIX—XIX of FIG. 18.

FIG. 18 is a schematic plane view of a subpixel unit of an electroluminescent display device according to another embodiment of the present invention, and FIG. 19 is a cross-sectional view taken along line XIX—XIX of FIG. 18. In the electroluminescent display devices according to the above-described embodiments, a pixel electrode of a display element, that is, an electroluminescent display element, is connected to a first electrode. However, in the electroluminescent display device according to the present embodiment, a pixel electrode of the electroluminescent display element is connected to a second electrode 1012.

In other words, the electroluminescent display device according to the present embodiment, like in the electroluminescent display devices according to the above-described embodiments, a first electrode 1011, the second electrode 1012, and a first gate electrode 1021 are included in a driving transistor, and a third electrode 1013 that surrounds the first electrode 1011, the second electrode 1012, and the first gate electrode 1021, a fourth electrode 1014, and a second gate electrode 1022 are included in a switching transistor. In the electroluminescent display device according to the present embodiment, like in the electroluminescent display devices shown in FIGS. 6 through 12, the fourth electrode 1014 is a source electrode of the switching transistor, and the third electrode 1013 is a drain electrode of the switching transistor.

However, in the electroluminescent display device according to the present embodiment, unlike in the electroluminescent display devices according to the above-described embodiments, the first electrode 1011 is a source electrode of the driving transistor, and the second electrode 1012 is a drain electrode of the driving transistor. In other words, the first electrode 1011 is connected to a second capacitor electrode 1032 of a storage capacitor 1030, and the second electrode 1012 is connected to a pixel electrode 1041 of the electroluminescent display element. With the above structure, an electroluminescent display device having a structure where the pixel electrode 1041 is connected to the second electrode 1012, that is, a structure where the drain electrode of the driving transistor surrounds the source electrode thereof, can be manufactured.

Figure 20:
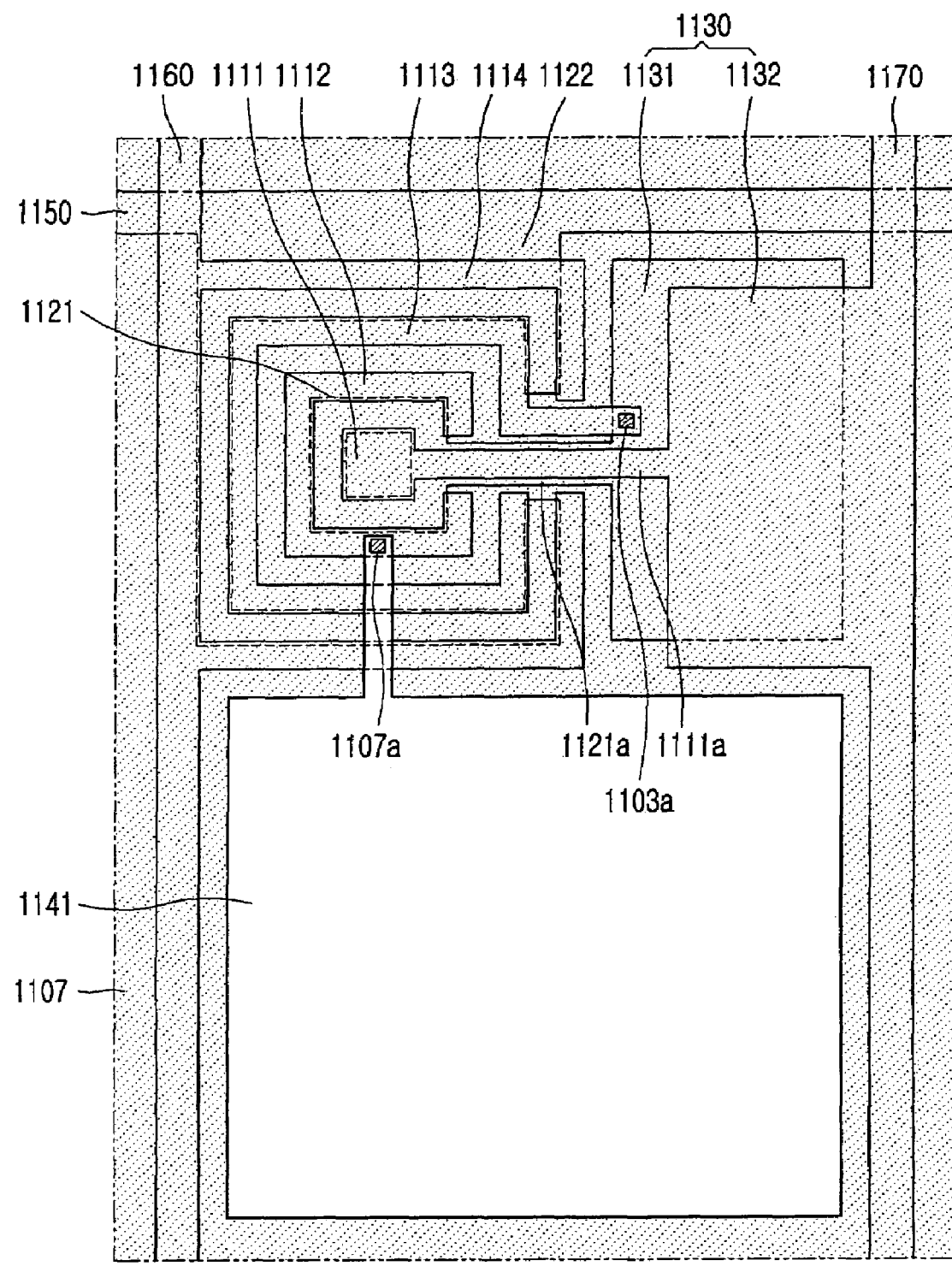
FIG. 20 is a schematic plane view of a subpixel unit of an electroluminescent display device according to another embodiment of the present invention.

FIG. 20 is a schematic plane view of a subpixel unit of an electroluminescent display device according to another embodiment of the present invention. The electroluminescent display device according to the present embodiment is different from the electroluminescent display device shown in FIG. 18 in that a connecting structure of a third electrode 1113 and a first capacitor electrode 1131 and a connecting structure of a first electrode 1111 and a second capacitor electrode 1132 are different from those of the electroluminescent display device shown in FIG. 18.

In the electroluminescent display device according to the present embodiment, like in the electroluminescent display device shown in FIG. 18, a first gate electrode 1121 and a second gate electrode 1122 are formed in the same plane, the second gate electrode 1122 partially surrounds the first gate electrode 1121, and a protrusion 1121a that protrudes from the first gate electrode 1121 through an opening of the second gate electrode 1122 is formed in the first gate electrode 1121. The protrusion 1121a is connected to the first capacitor electrode 1131 of a storage capacitor 1130. The first gate electrode 1121, the protrusion 1121a formed in the first gate electrode 1121, and the first capacitor electrode 1131 can be formed of the same material as a single body.

In this embodiment, in the electroluminescent display device shown in FIG. 18, a protrusion 1021a formed in the first gate electrode 1021 is connected to the third electrode 1013, that is, a drain electrode of a switching transistor, via a contact hole 1003a formed in the gate insulating layer 1003 formed on the protrusion 1021a. By doing so, the third electrode 1013 and the first capacitor electrode 1031 are connected to each other.

However, in the electroluminescent display device according to the present embodiment, the fourth electrode 1114 partially surrounds the third electrode 1113 in the same plane, a protrusion 1113a that protrudes from the third electrode 1113 through an opening of the fourth electrode 1114 is formed in the third electrode 1113, the protrusion 1113a is formed on the first capacitor electrode 1131 and is connected to the first capacitor electrode 1131 via the contact hole 1103a formed in the gate insulating layer 1103 formed on the first capacitor electrode 1131, such that the third electrode 1113 and the first capacitor electrode 1131 are connected to each other.

In the meantime, in the electroluminescent display device shown in FIG. 18, the second capacitor electrode 1032 is formed on the protective layer 1007 and is connected to the first electrode 1011 via the contact hole formed in the protective layer 1007. Thus, the first electrode 1011 and the second capacitor electrode 1032 are connected to each other.

However, in the electroluminescent display device according to the present embodiment, the second electrode 1112 partially surrounds the first electrode 1111 in the same plane, the third electrode 1112 partially surrounds the second electrode 1112, the fourth electrode 1114 partially surrounds the third electrode 1113, a protrusion 1111a that protrudes from the first electrode 1111 through an opening of the second electrode 1112, an opening of the third electrode 1113, and an opening of the fourth electrode 1114 is formed in the first electrode 1111, and the protrusion 1111a is connected to the second capacitor electrode 1132.

In this embodiment, the first electrode 1111, the protrusion 1111a formed in the first electrode 1111, and the second capacitor electrode 1132 can be simultaneously formed of the same material on the gate insulating layer 1103. In this embodiment, as a distance between the first capacitor electrode 1131 and the second capacitor electrode 1132 becomes smaller, the electrostatic capacity of the storage capacitor 1130 can be increased.

With the above structure, the third electrode 1113 and the first capacitor electrode 1131 can be more securely connected to each other, the electroluminescent display device can be manufactured using fewer contact holes than in the electroluminescent display device shown in FIG. 18, such that a defect rate in the manufacture of the electroluminescent display device can be reduced. In addition, a distance between electrodes of a storage capacitor 1130 is made smaller so that the electrostatic capacity of the storage capacitor 1130 is increased.

Figure 21:
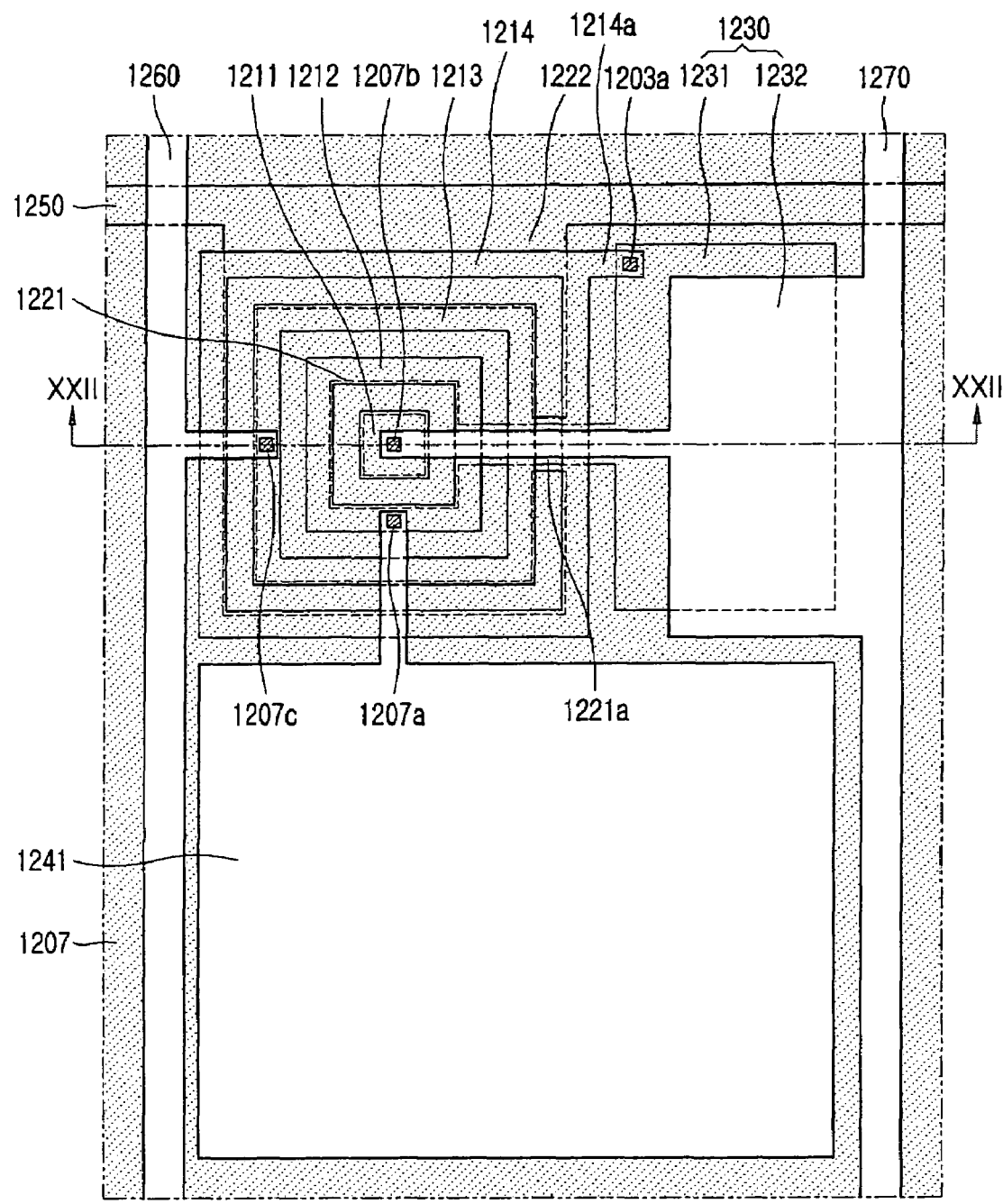
FIG. 21 is a schematic plane view of a subpixel unit of an electroluminescent display device according to another embodiment of the present invention.
Figure 22:
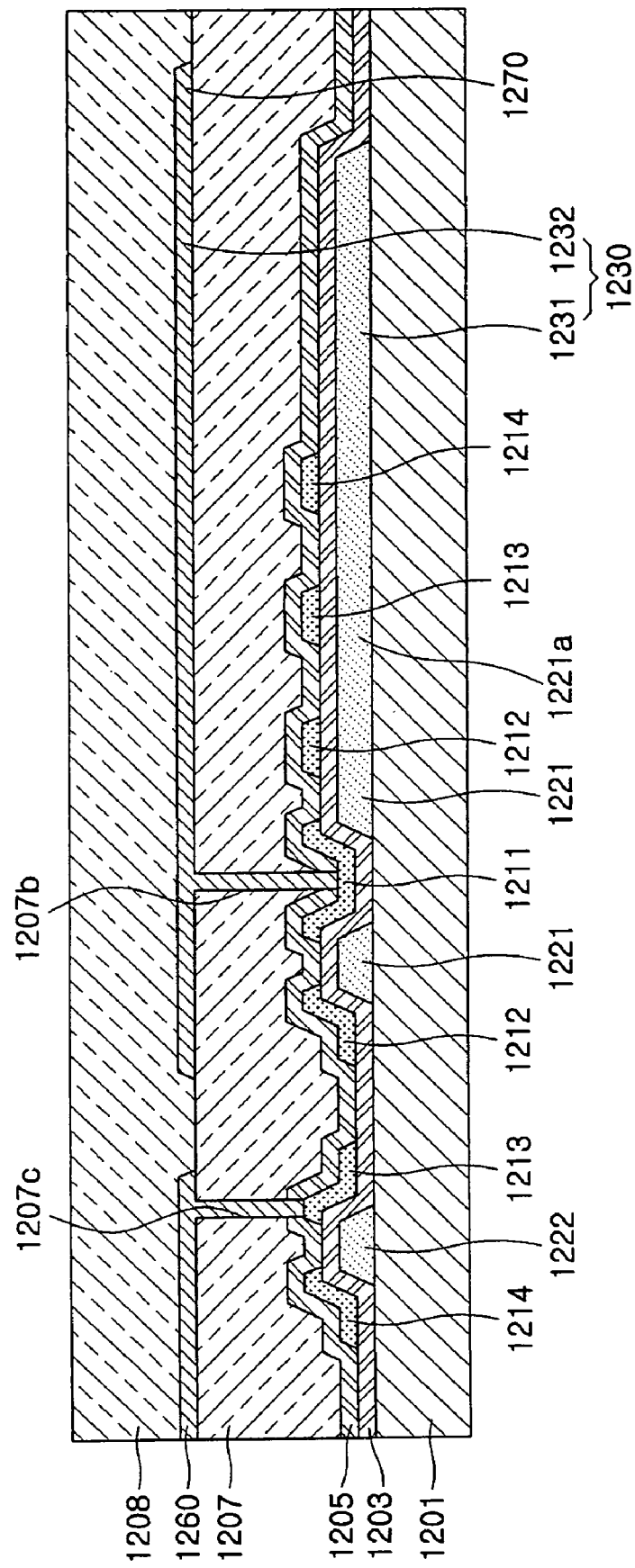
FIG. 22 is a cross-sectional view taken along line XXII—XXII of FIG. 21.

FIG. 21 is a schematic plane view of a subpixel unit of an electroluminescent display device according to another embodiment of the present invention, and FIG. 22 is a cross-sectional view taken along line XXII—XXII of FIG. 21. In the electroluminescent display device according to the present embodiment, like in the electroluminescent display devices shown in FIGS. 18 and 20, a pixel electrode 1241 of the electroluminescent display element is connected to a second electrode 1212.

In other words, in the electroluminescent display device according to the present embodiment, like in the electroluminescent display devices according to the above-described embodiments, a first electrode 1211, a second electrode 1212, and a first gate electrode 1221 are included in a driving transistor, and a third electrode 1213 that surrounds the first electrode 1211, the second electrode 1212, and the first gate electrode 1221, a fourth electrode 1214, and a second gate electrode 1222 are included in a switching transistor. The first electrode 1211 is a source electrode of the driving transistor, and the second electrode 1212 is a drain electrode of the driving transistor. In other words, the first electrode 1211 is connected to a second capacitor electrode 1232 of the storage capacitor 1230, and the second electrode 1212 is connected to the pixel electrode 1241 of the electroluminescent display device.

However, in the electroluminescent display device according to the present embodiment, unlike in the electroluminescent display devices shown in FIGS. 18 and 20, the third electrode 1213 is a source electrode of the switching transistor and is connected to a second conducting line 1260, and the fourth electrode 1214 is a drain electrode of the switching transistor and is connected to a first capacitor electrode 1231.

In this embodiment, a contact hole 1207c is formed on the third electrode 1213 and is connected to the second conducting line 1260. A protrusion 1214a that protrudes in a direction of the first capacitor electrode 1231 is formed in the fourth electrode 1214, and the protrusion 1214a is connected to the first capacitor electrode 1231 via a contact hole 1203a formed on the first capacitor electrode 1231, such that the fourth electrode 1214 and the first capacitor electrode 1231 are connected to each other. In the meantime, referring to FIG. 22, the second conducting line 1260, the pixel electrode 1241, and the second capacitor electrode 1232 are formed on a protective layer 1207 and can be simultaneously formed of the same material.

With the above structure, an electroluminescent display device having a structure where the pixel electrode 1241 is connected to the second electrode 1213, that is, a structure where a drain electrode of a driving transistor surrounds a source electrode thereof and the third electrode 1213 is a source electrode of the switching transistor, can be manufactured.

Figure 23:
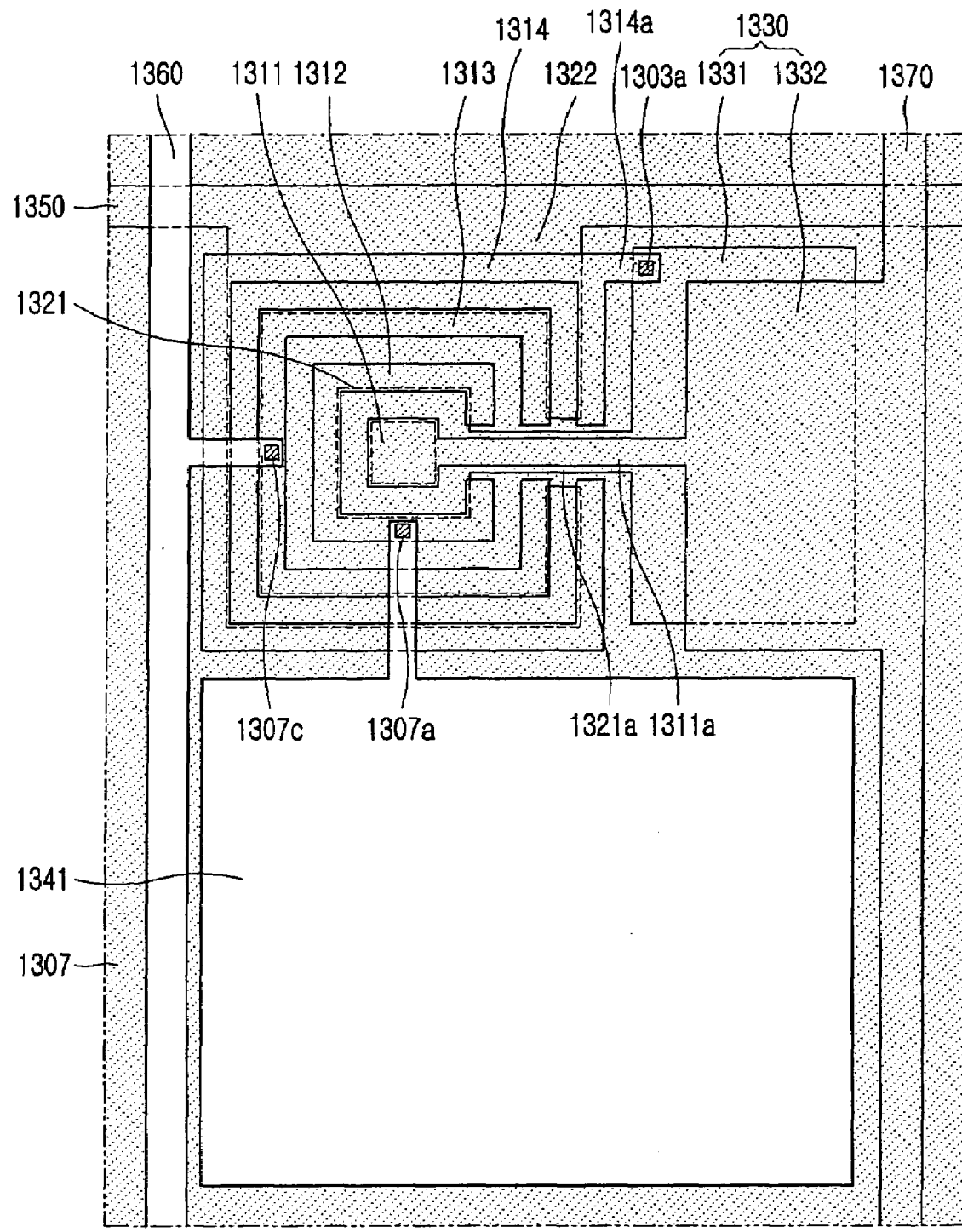
FIG. 23 is a schematic plane view of a subpixel unit of an electroluminescent display device according to another embodiment of the present invention.

FIG. 23 is a schematic plane view of a subpixel unit of an electroluminescent display device according to another embodiment of the present invention. In the electroluminescent display device according to the present embodiment, like in the electroluminescent display device shown in FIG. 21, a source electrode of a switching transistor, that is, a third electrode 1313, and a drain electrode of the switching transistor, that is, a fourth electrode 1314, surround a source electrode of a driving transistor, that is, a first electrode 1311, and a drain electrode of the driving transistor, that is, a second electrode 1312. The drain electrode of the driving transistor, that is, the second electrode 1312 surrounds the source electrode of the driving transistor, that is, the first electrode 1311, and the drain electrode of the switching transistor, that is, the fourth electrode 1314, surrounds the drain electrode of the switching transistor, that is, the third electrode 1313.

In the above structure, the electroluminescent display device according to the present embodiment is different from the electroluminescent display device shown in FIG. 21 in that a structure where a source electrode of the driving transistor, that is, the first electrode 1311, is connected to a second capacitor electrode 1332 is different from a structure of the electroluminescent display device shown in FIG. 21.

In the electroluminescent display device shown in FIG. 21, the second capacitor electrode 1232 is formed on the protective layer 1207 and is connected to the first electrode 1211 via a contact hole 1207b formed in the protective layer 1207 and the semiconductor layer 1205.

However, in the electroluminescent display device according to the present embodiment, the second electrode 1312 partially surrounds the first electrode 1311 in the same plane, the third electrode 1313 partially surrounds the second electrode 1312 in the same plane, the fourth electrode 1314 partially surrounds the third electrode 1313 in the same plane, a protrusion 1311a that protrudes from the first electrode 1311 through an opening of the second electrode 1312, an opening of the third electrode 1313, and an opening of the fourth electrode 1314, is formed in the first electrode 1311, and the protrusion 1311a is connected to the second capacitor electrode 1332, such that the first electrode 1311 and the second capacitor electrode 1332 are connected to each other. In this embodiment, the first electrode 1311, the protrusion 1311a formed in the first electrode 1311, and the second capacitor electrode 1332 can be formed in the same plane, that is, on the gate insulating layer 1303, and can be simultaneously formed of the same material.

With the above structure, the electroluminescent display device can be manufactured using fewer contact holes than in the electroluminescent display device shown in FIG. 21, such that a defect rate in the manufacture of the electroluminescent display device can be reduced. In addition, a distance between electrodes of a storage capacitor 1330 is made small so that the electrostatic capacity of the storage capacitor 1330 is increased.

Figure 24:
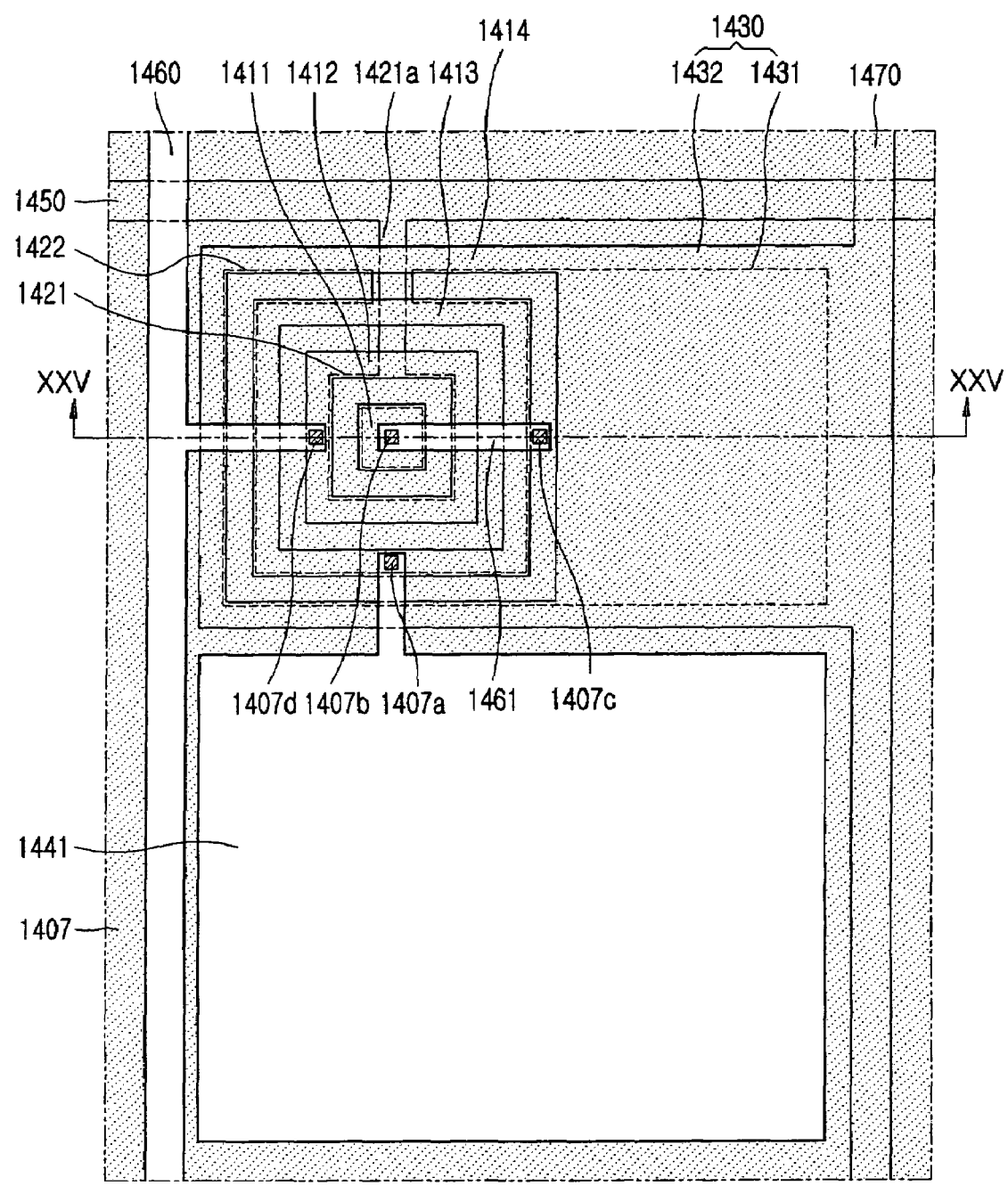
FIG. 24 is a schematic plane view of a subpixel unit of an electroluminescent display device according to another embodiment of the present invention.
Figure 25:
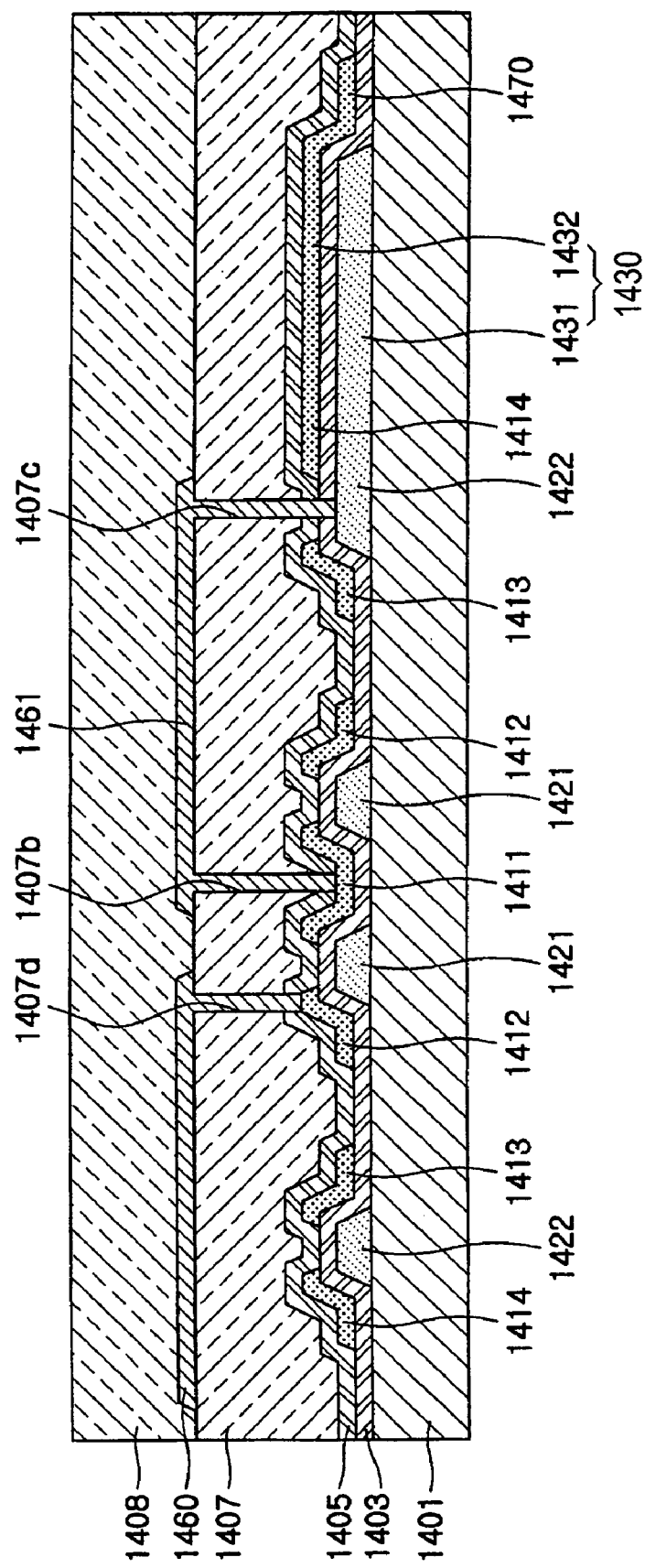
FIG. 25 is a cross-sectional view taken along line XXV—XXV of FIG. 24.

FIG. 24 is a schematic plane view of a subpixel unit of an electroluminescent display device according to another embodiment of the present invention, and FIG. 25 is a cross-sectional view taken along line XXV—XXV of FIG. 24. In the electroluminescent display devices according to the above-described embodiments, a pixel electrode of a display element, that is, an electroluminescent display element, is connected to one of a first electrode and a second electrode. However, in the electroluminescent display device according to the present embodiment, a pixel electrode of an electroluminescent display element is connected to a third electrode 1413.

In other words, in the electroluminescent display device according to the present embodiment, unlike in the electroluminescent display devices according to the above-described embodiments, a first electrode 1411, a second electrode 1412, and a first gate electrode 1421 are included in a switching transistor, and a third electrode 1413 that surrounds the first electrode 1411, the second electrode 1412, and the first gate electrode 1421 are included in a driving transistor. In the electroluminescent display device according to the present embodiment, the second electrode 1412 is a source electrode of the switching transistor, the first electrode 1411 is a drain electrode of the switching transistor, the fourth electrode 1414 is a source electrode of the driving transistor, and the third electrode 1413 is a drain electrode of the driving transistor.

In this embodiment, a contact hole 1407d is formed on the second electrode 1412 and is connected to a second conducting line 1460. A first capacitor electrode 1431 is connected to the second gate electrode 1422, that is, a gate electrode of the driving transistor, and a second capacitor electrode 1432 is connected to the fourth electrode 1414, that is, a source electrode of the driving transistor. In this embodiment, the second gate electrode 1422 and the first capacitor electrode 1431 and the fourth electrode 1414 and the second capacitor electrode 1432, respectively, can be formed as a single body.

The first electrode 1411, that is, the drain electrode of the switching transistor, is connected to the second gate electrode 1422, that is, a gate electrode of the driving transistor, and the first capacitor electrode 1431 is formed as a single body with the second gate electrode 1422. This connecting procedure is carried out by a connecting line 1461 having a bridge shape formed on a protective layer 1407 which covers a contact hole 1407b formed on the first electrode 1411, a contact hole 1407c formed on the second gate electrode 1422, the first through fourth electrodes 1411, 1412, 1413, and 1414, the semiconductor layer 1405, and a storage capacitor 1430.

In this embodiment, referring to FIGS. 24 and 25, the second conducting line 1460, the pixel electrode 1441, and the connecting line 1461 having the bridge shape are formed on the protective layer 1407 and can be simultaneously formed of the same material.

With the above structure, an electroluminescent display device having a structure where the pixel electrode 1441 is connected to the third electrode 1413, that is, a structure where a source electrode and a drain electrode of a driving transistor surround a source electrode and a drain electrode of a switching transistor and the source electrode of the switching transistor surrounds the drain electrode of the switching transistor, can be manufactured.

Figure 26:
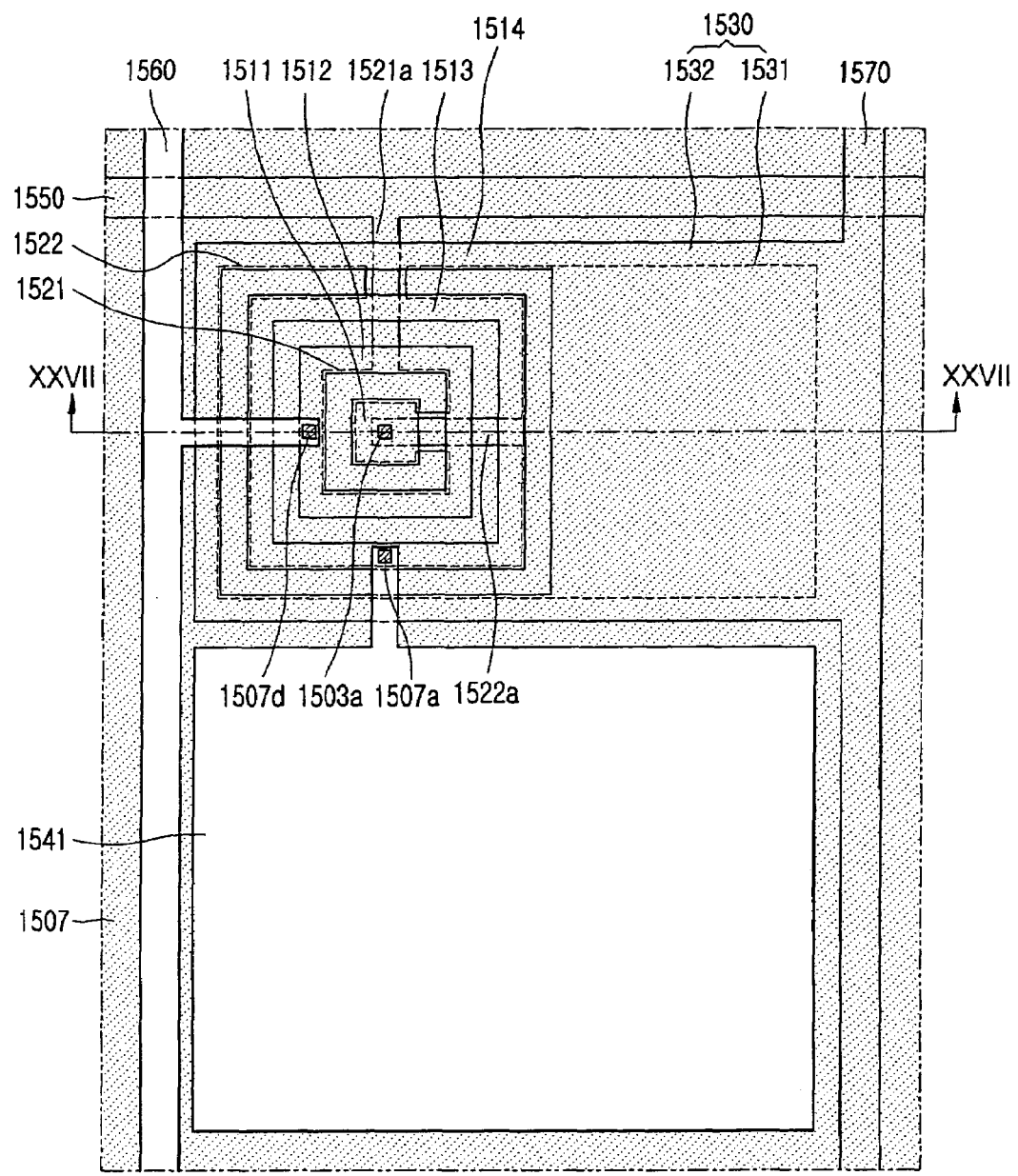
FIG. 26 is a schematic plane view of a subpixel unit of an electroluminescent display device according to another embodiment of the present invention.
Figure 27:
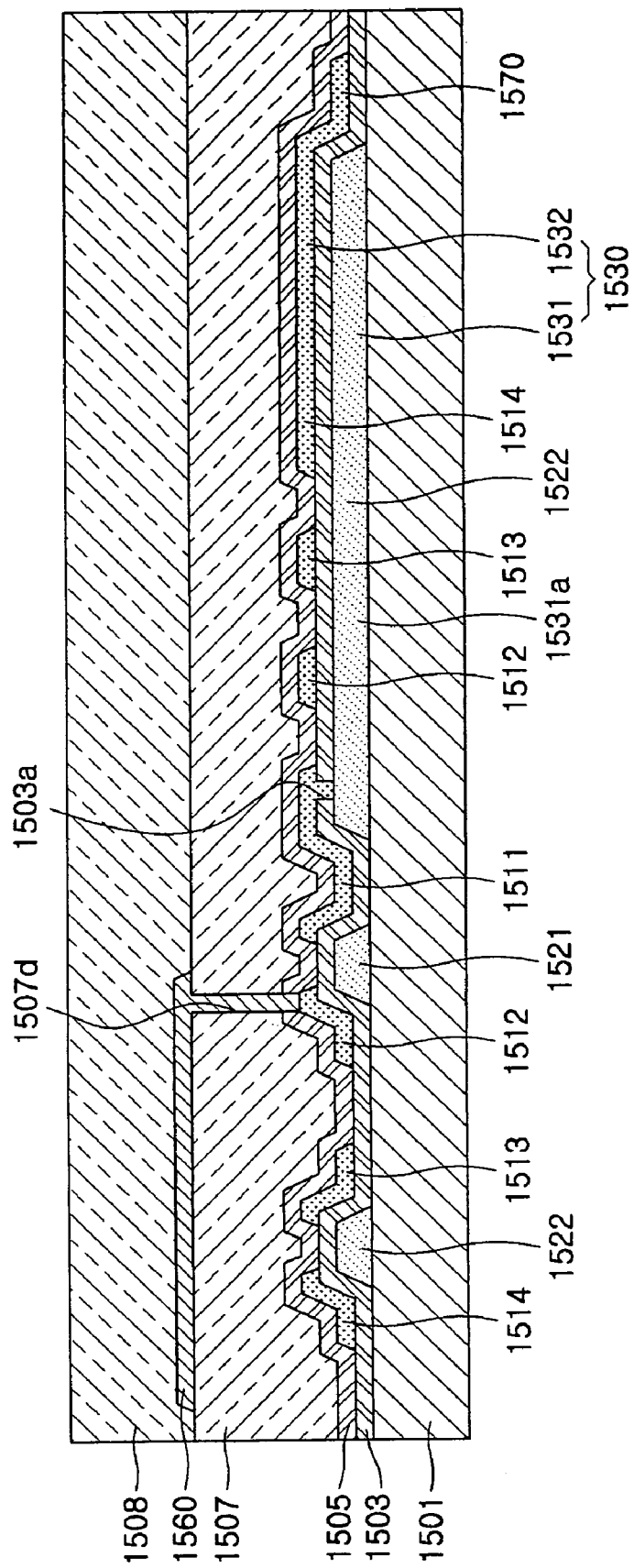
FIG. 27 is a cross-sectional view taken along line XXVII—XXVII of FIG. 26.

FIG. 26 is a schematic plane view of a subpixel unit of an electroluminescent display device according to another embodiment of the present invention, and FIG. 27 is a cross-sectional view taken along line XXVII—XXVII of FIG. 26. The electroluminescent display device shown in FIG. 26 is different from the electroluminescent display device shown in FIG. 24 in that a connecting structure of a first electrode 1511 and a second gate electrode 1522 is different from that of the electroluminescent display device shown in FIG. 24.

Even in the electroluminescent display device shown in FIG. 24, like in the electroluminescent display device according to the present embodiment, a first electrode 1411, that is, a drain electrode of a switching transistor, is connected to the second gate electrode 1422, that is, a gate electrode of a driving transistor, and the first capacitor electrode 1431 formed as a single body with the second gate electrode 1422. This connecting procedure is carried out by the connecting line 1461 having the bridge shape formed on the protective layer 1407 which covers the contact hole 1407b formed on the first electrode 1411, the contact hole 1407c formed on the second gate electrode 1422, the first through fourth electrodes 1411, 1412, 1413, and 1414, the semiconductor layer 1405, and the storage capacitor 1430.

However, in the electroluminescent display device according to the present embodiment, a portion of a first gate electrode 1521 having a donut shape and formed under a first electrode 1511 which is a drain electrode of a switching transistor, is exposed, and a protrusion 1522a that extends to a lower portion of the first electrode 1511 via the opening of the first gate electrode 1521 is formed in the second gate electrode 1522. A contact hole 1503a is formed in a gate insulating layer 1503 formed under the first electrode 1511 and the first electrode 1511 and the protrusion 1522a are connected to each other, such that the first electrode 1511 and the second gate electrode 1522 are connected to each other.

With the above structure, an electroluminescent display device can be manufactured using fewer contact holes than in the electroluminescent display devices shown in the above-described embodiments, such that a defect rate in the manufacture of the electroluminescent display device can be reduced.

Figure 28:
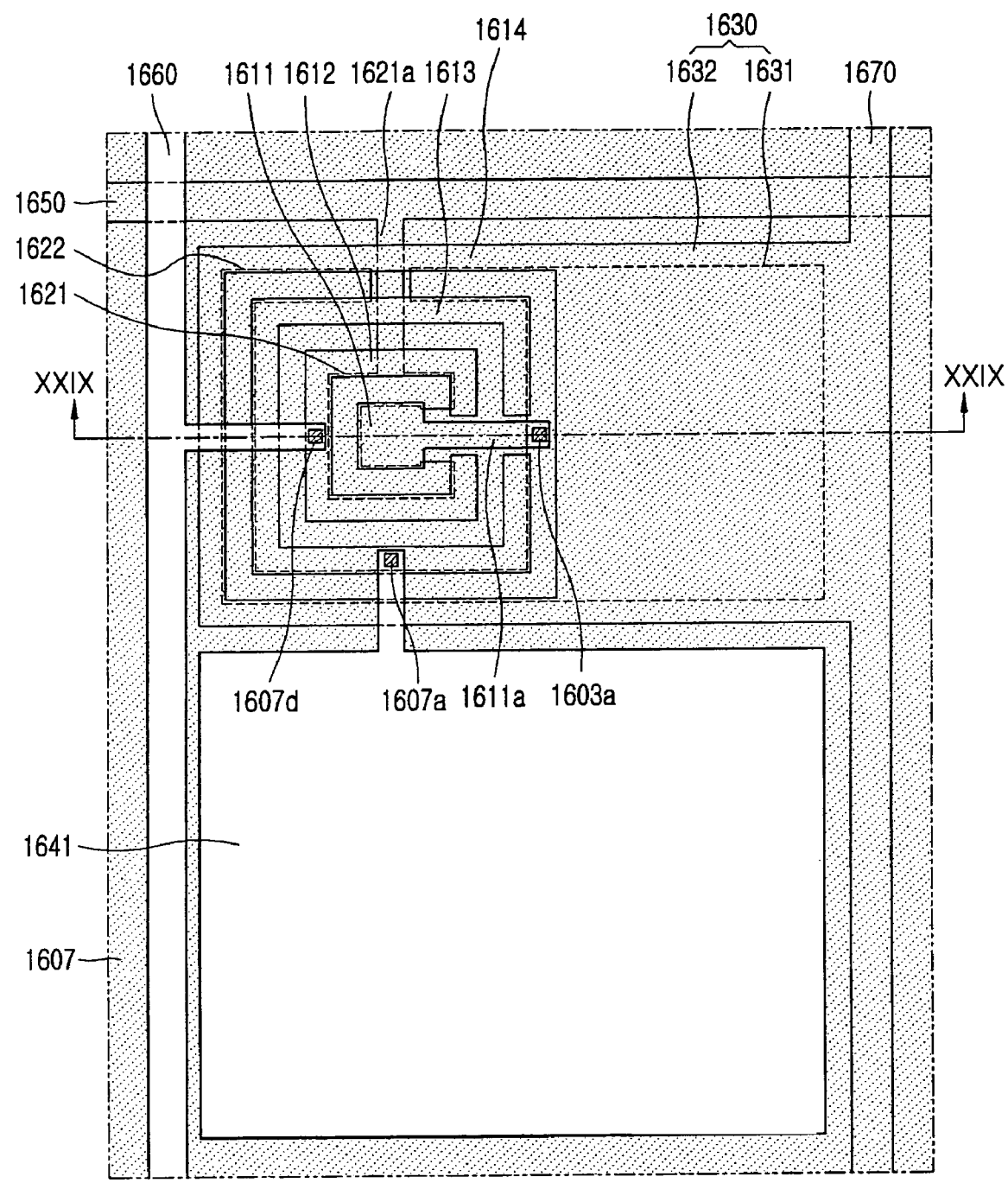
FIG. 28 is a schematic plane view of a subpixel unit of an electroluminescent display device according to another embodiment of the present invention.
Figure 29:
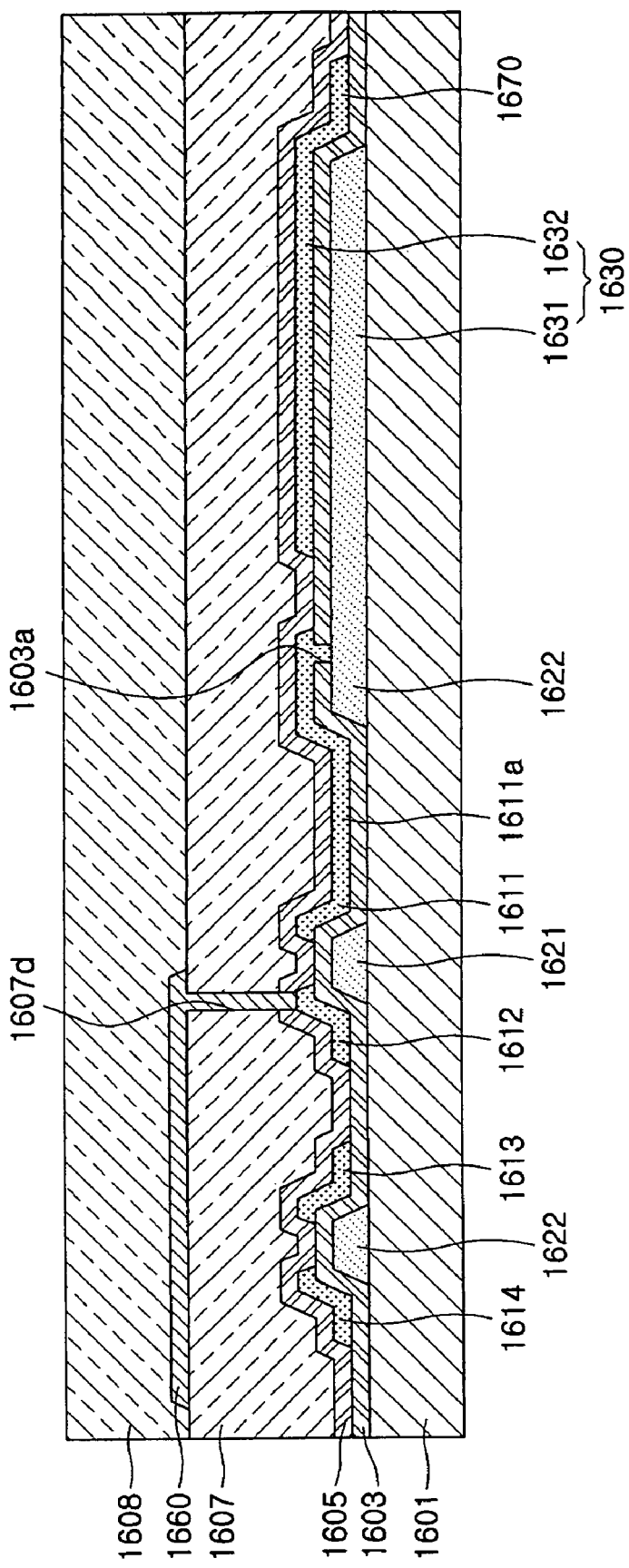
FIG. 29 is a cross-sectional view taken along line XXIX—XXIX of FIG. 28.

FIG. 28 is a schematic plane view of a subpixel unit of an electroluminescent display device according to another embodiment of the present invention, and FIG. 29 is a cross-sectional view taken along line XXIX—XXIX of FIG. 28. The electroluminescent display device shown in FIG. 28 is different from the electroluminescent display devices shown in FIGS. 24 and 26 in that a connecting structure of a first electrode 1611 and a second gate electrode 1622 is different from those of the electroluminescent display devices shown in FIGS. 24 and 26.

In the electroluminescent display devices shown in FIGS. 24 and 26, like in the electroluminescent display device according to the present embodiment, first electrodes 1411 and 1511, that is, the drain electrodes of a switching transistor are connected to second gate electrodes 1422 and 1522, that is, the gate electrodes of a driving transistor, and first capacitor electrodes 1431 and 1531 are formed as a single body with the second gate electrodes 1422 and 1522.

In the electroluminescent display device shown in FIG. 24, this connecting procedure is carried out by the conducting line 1461 having a bridge shape formed on the protective layer 1407 which covers the contact hole 1407b formed on the first electrode 1411, the contact hole 1407c formed on the second gate electrode 1422, the first through fourth electrodes 1411, 1412, 1413, and 1414, the semiconductor layer 1405, and the storage capacitor 1430.

In the electroluminescent display device shown in FIG. 26, a portion of the first gate electrode 1521 having a donut shape and formed under the first electrode 1511 which is a drain electrode of a switching transistor, is exposed, and the protrusion 1522a that extends to a lower portion of the first electrode 1511 via the opening of the first gate electrode 1521 is formed in the second gate electrode 1522. The contact hole 1503a is formed in the gate insulating layer 1503 formed under the first electrode 1511 and the first electrode 1511 and the protrusion 1522a are connected to each other, such that the first electrode 1511 and the second gate electrode 1522 are connected to each other.

However, in the electroluminescent display device according to the present embodiment, a second electrode 1612 partially surrounds the first electrode 1611 in the same plane, a third electrode 1613 partially surrounds the second electrode 1612 in the same plane, a protrusion 1611a that protrudes from the first electrode 1611 through an opening of the second electrode 1612 and an opening of the third electrode 1613 is formed in the first electrode 1611, and the protrusion 1611a is connected to the second gate electrode 1622, such that the first electrode 1611 and the second gate electrode 1622 are connected to each other. In this embodiment, the protrusion 1611a and the second gate electrode 1622 are connected to each other via a contact hole 1603a formed on the second gate electrode 1622. With the above structure, the first electrode 1611 and the second gate electrode 1622 can be more securely connected to each other.

Figure 30:
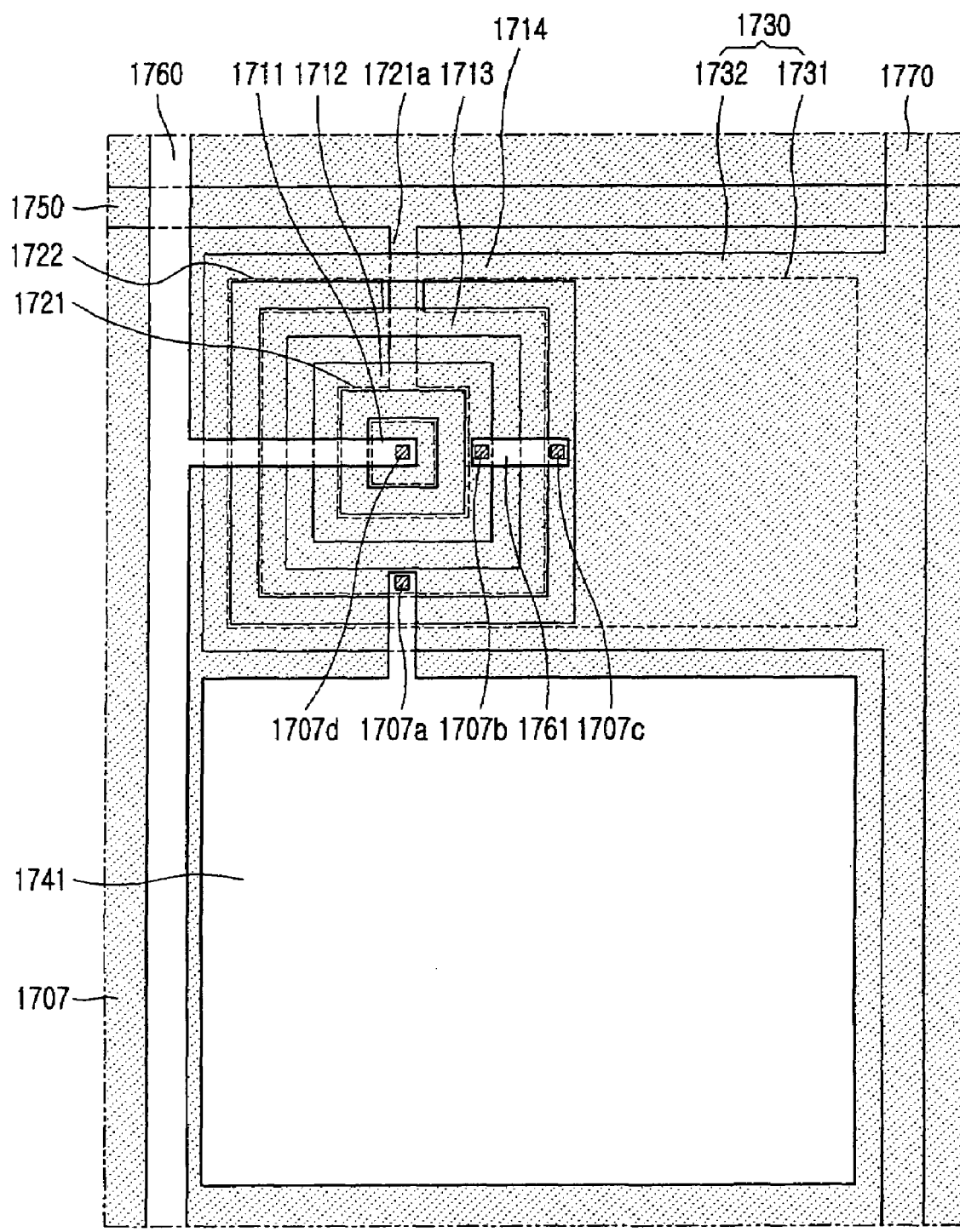
FIG. 30 is a schematic plane view of a subpixel unit of an electroluminescent display device according to another embodiment of the present invention.

FIG. 30 is a schematic plane view of a subpixel unit of an electroluminescent display device according to another embodiment of the present invention. In the electroluminescent display device shown in FIG. 30, like in the electroluminescent display devices shown in FIGS. 24 through 28, a first electrode 1711, a second electrode 1712, and a first gate electrode 1721 are included in a switching transistor, and a third electrode 1713 that surrounds the first electrode 1711, the second electrode 1712, and the first gate electrode 1721, a fourth electrode 1714, and a second gate electrode 1722 are included in a driving transistor. The fourth electrode 1714 is a source electrode of the driving transistor, and the third electrode 1713 is a drain electrode of the driving transistor. However, in the electroluminescent display device according to the present embodiment, unlike in the electroluminescent display devices shown in FIGS. 24 through 28, the first electrode 1711 is a source electrode of the switching transistor, and the second electrode 1712 is a drain electrode of the switching transistor.

In this embodiment, a contact hole 1707d is formed on the first electrode 1711 and is connected to a second conducting line 1760. A first capacitor electrode 1731 is connected to the second gate electrode 1722, that is, a gate electrode of the driving transistor, and a second capacitor electrode 1732 is connected to the fourth electrode 1714, that is, a source electrode of the driving transistor. In this embodiment, the first gate electrode 1722 and the first capacitor electrode 1731 and the fourth electrode 1714 and the second capacitor electrode 1732, respectively, can be formed as a single body.

The second electrode 1712, that is, a drain electrode of the switching transistor, is connected to the second gate electrode 1722, that is, a gate electrode of the driving transistor, and the first capacitor electrode 1731 formed as a single body with the second gate electrode 1722. This connecting procedure is carried out by a connecting line 1761 having a bridge shape formed on a protective layer 1707 which covers a contact hole 1707b formed on the second electrode 1712, a contact hole 1707c formed on the second gate electrode 1722, the first through fourth electrodes 1711, 1712, 1713, and 1714, a semiconductor layer 1705, and a storage capacitor 1730.

In this embodiment, referring to FIG. 30, the second conducting line 1760, a pixel electrode 1741, and the connecting line 1761 having the bridge shape are formed on the protective layer 1707 and can be simultaneously formed of the same material.

With the above structure, an electroluminescent display device having a structure where the pixel electrode 1741 is connected to the third electrode 1713, that is, a structure where a source electrode and a drain electrode of a driving transistor surround a source electrode and a drain electrode of a switching transistor and the source electrode of the switching transistor surrounds the drain electrode of the switching transistor, can be manufactured.

Figure 31:
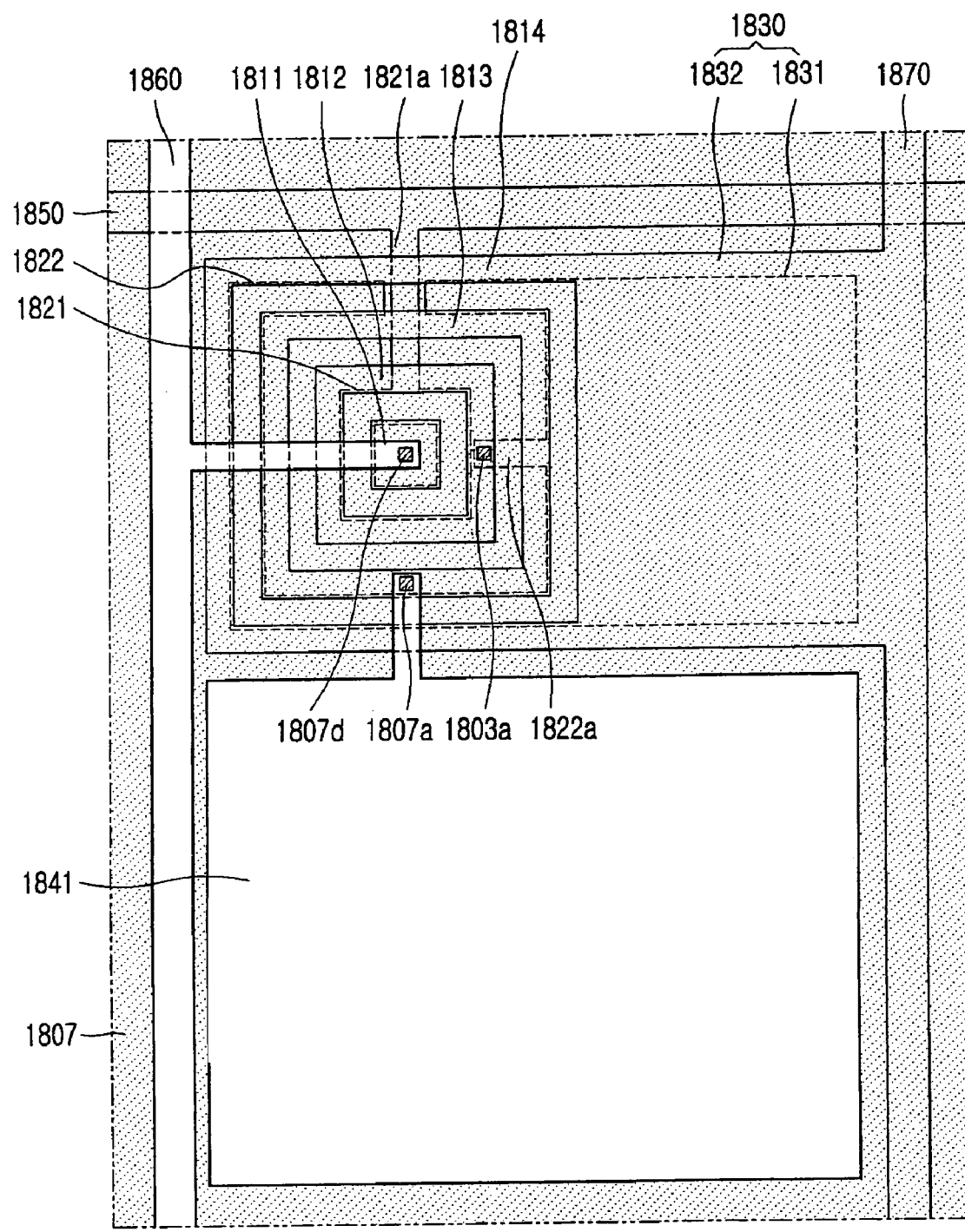
FIG. 31 is a schematic plane view of a subpixel unit of an electroluminescent display device according to another embodiment of the present invention.

FIG. 31 is a schematic plane view of a subpixel unit of an electroluminescent display device according to another embodiment of the present invention. The electroluminescent display device shown in FIG. 31 is different from the electroluminescent display device shown in FIG. 30 in that a connecting structure of a second electrode 1812 and a second gate electrode 1822 is different from that of the electroluminescent display device shown in FIG. 30.

Even in the electroluminescent display device shown in FIG. 30, like in the electroluminescent display device according to the present embodiment, the second electrode 1712, that is, a drain electrode of a switching transistor, is connected to the second gate electrode 1722, that is, a gate electrode of a driving transistor, and the first capacitor electrode 1731 formed as a single body with the second gate electrode 1722. This connecting procedure is carried out by the connecting line 1761 having the bridge shape formed on the protective layer 1707 which covers the contact hole 1707b formed on the second electrode 1712, the contact hole 1707c formed on the second gate electrode 1722, the first through fourth electrodes 1711, 1712, 1713, and 1714, the semiconductor layer 1705, and the storage capacitor 1730.

However, in the electroluminescent display device according to the present embodiment, a protrusion 1822a extends to a lower portion of the second electrode 1812 which is a drain electrode of a switching transistor. A contact hole 1803a is formed in a gate insulating layer 1803 formed under the second electrode 1812 and the second electrode 1812 and the protrusion 1822a are connected to each other, such that the second electrode 1812 and the second gate electrode 1822 are connected to each other. With the above structure, an electroluminescent display device can be manufactured using fewer contact holes than in the electroluminescent display devices shown in the above-described embodiments, such that a defect rate in the manufacture of the electroluminescent display device can be reduced.

Figure 32:
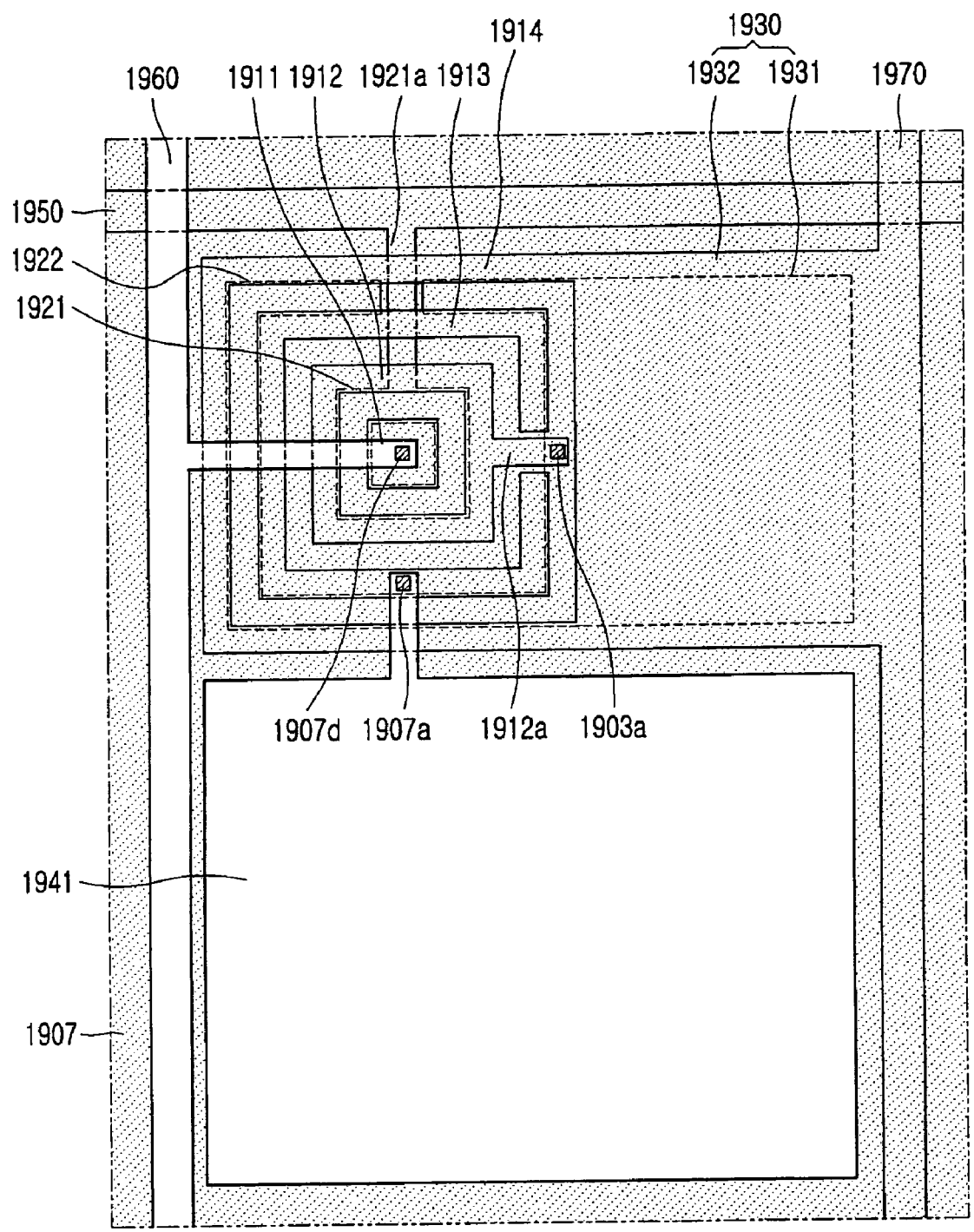
FIG. 32 is a schematic plane view of a subpixel unit of an electroluminescent display device according to another embodiment of the present invention.

FIG. 32 is a schematic plane view of a subpixel unit of an electroluminescent display device according to another embodiment of the present invention. The electroluminescent display device shown in FIG. 32 is different from the electroluminescent display devices shown in FIGS. 30 and 31 in that a connecting structure of a second electrode 1912 and a second gate electrode 1922 is different from those of the electroluminescent display devices shown in FIGS. 30 and 31.

In the display devices shown in FIGS. 30 and 31, like in the electroluminescent display device according to the present embodiment, second electrodes 1712 and 1812, that is, a drain electrode of a switching transistor, are connected to second gate electrodes 1722 and 1822, that is, a gate electrode of a driving transistor, and first capacitor electrodes 1731 and 1831 are formed as a single body with the second gate electrodes 1722 and 1822.

In the electroluminescent display device shown in FIG. 30, this connecting procedure is carried out by the conducting line 1761 having a bridge shape formed on the protective layer 1707 which covers the contact hole 1707b formed on the second electrode 1712, the contact hole 1707c formed on the second gate electrode 1722, the first through fourth electrodes 1711, 1712, 1713, and 1714, the semiconductor layer 1705, and the storage capacitor 1730.

In the electroluminescent display device shown in FIG. 31, the protrusion 1822a that extends to a lower portion of the second electrode 1812 which is the drain electrode of the switching transistor is formed in the second gate electrode 1822. The contact hole 1803a is formed in the gate insulating layer 1803 formed under the second electrode 1812 and the second electrode 1812 and the protrusion 1822a are connected to each other, such that the second electrode 1812 and the second gate electrode 1822 are connected to each other.

However, in the electroluminescent display device according to the present embodiment, a third electrode 1913 partially surrounds the second electrode 1912 in the same plane, a protrusion 1912a that protrudes from the second electrode 1912 through an opening of the third electrode 1913 is formed in the second electrode 1912, and the protrusion 1912a is connected to the second gate electrode 1922, such that the second electrode 1912 and the second gate electrode 1922 are connected to each other. In this embodiment, the protrusion 1912a and the second gate electrode 1922 are connected to each other via a contact hole 1903a formed on the second gate electrode 1922. With the above structure, the second electrode 1912 and the second gate electrode 1922 can be more securely connected to each other.

As described above, the following effects can be obtained with the thin film transistor (TFT) and the flat panel display device having the same according to the present invention. First, each TFT has a structure where one of a source electrode and a drain electrode surrounds the other electrode thereof in the same plane and simultaneously, a source electrode and a drain electrode of one TFT are surrounded by a source electrode and a drain electrode of the other TFT, such that cross-talk between TFTs where a semiconductor layer is not patterned can be prevented from occurring.

Second, by using a structure where one of a source electrode and a drain electrode partially surrounds the other electrode thereof in the same plane, the other electrode is connected to other elements via an opening of an electrode that surrounds the other electrode such that the connecting structure can be simply and securely made.

Third, each TFT has a structure where one of a source electrode and a drain electrode surrounds the other electrode thereof in the same plane and simultaneously, a source electrode and a drain electrode of one TFT are surrounded by a source electrode and a drain electrode of the other TFT, such that the area of the TFTs can be greatly reduced.

Fourth, each TFT has a structure where one of a source electrode and a drain electrode surrounds the other electrode thereof in the same plane and simultaneously, a source electrode and a drain electrode of one TFT are surrounded by a source electrode and a drain electrode of the other TFT, such that a flat panel display device where cross-talk between TFTs where a semiconductor layer is not patterned is prevented from occurring can be manufactured and an image is not distorted and the sharpeness of the image is not degraded.

Fifth, each TFT has a structure where one of a source electrode and a drain electrode surrounds the other electrode thereof in the same plane and simultaneously, a source electrode and a drain electrode of one TFT are surrounded by a source electrode and a drain electrode of the other TFT, such that the area of the TFTs can be greatly reduced and in the embodiment of a back-side emission flat panel display device where light is emitted in a direction of a substrate, a flat panel display device having a larger opening ratio can be manufactured.

Sixth, each TFT has a structure where one of a source electrode and a drain electrode surrounds the other electrode thereof in the same plane and simultaneously, a source electrode and a drain electrode of one TFT are surrounded by a source electrode and a drain electrode of the other TFT, such that the area of the TFTs can be greatly reduced and in the embodiment of a front emission display device where light is emitted in a direction opposite to the substrate, a flat panel display device with higher resolution can be manufactured.

While the present invention has been particularly shown and described with reference to exemplary embodiments thereof, it will be understood by those of ordinary skill in the art that various changes in form and details can be made therein without departing from the spirit and scope of the present invention as defined by the following claims.

What is claimed is:

1. A semiconductor device, comprising:
   a first electrode arranged on a first plane;
   a second electrode surrounding the first electrode and arranged on the first plane;
   a third electrode surrounding the second electrode and arranged on the first plane;
   a fourth electrode surrounding the third electrode and arranged on the first plane;
   a first gate electrode insulated from the first through fourth electrodes and arranged on a second plane that is parallel to and different from the first plane, the first gate electrode corresponding to a space between the first electrode and the second electrode;
   a second gate electrode insulated from the first through fourth electrodes and arranged on a third plane that is parallel to and different from the first plane, the second gate electrode corresponding to a space between the third electrode and the fourth electrode; and
   a semiconductor layer insulated from the first gate electrode and the second gate electrode and contacting the first through fourth electrodes.

2. The semiconductor device of claim 1, wherein the second plane and the third plane are identical.

3. The semiconductor device of claim 2, wherein the second gate electrode partially surrounds the first gate electrode, and a protrusion that protrudes from the first gate electrode through an opening of the second gate electrode is arranged in the first gate electrode.

4. The semiconductor device of claim 1, wherein the second plane and the third plane are arranged on a same side of the first plane.

5. The semiconductor device of claim 1, wherein the semiconductor layer is an organic semiconductor layer.

6. The semiconductor device of claim 1, further comprising a gate insulating layer insulating the first through fourth electrodes and the semiconductor layer from the first gate electrode and the second gate electrode.

7. A flat panel display device, comprising:
   a substrate;
   a first electrode arranged on a first plane;
   a second electrode surrounding the first electrode and arranged on the first plane;
   a third electrode surrounding the second electrode and arranged on the first plane;
   a fourth electrode surrounding the third electrode and arranged on the first plane;
   a first gate electrode insulated from the first through fourth electrodes and arranged on a second plane that is parallel to and different from the first plane, the first gate electrode corresponding to a space between the first electrode and the second electrode;
   a second gate electrode insulated from the first through fourth electrodes and arranged on a third plane that is parallel to and different from the first plane, the second gate electrode corresponding to a space between the third electrode and the fourth electrode;
   a semiconductor layer insulated from the first gate electrode and the second gate electrode and contacting the first through fourth electrodes; and
   a display element including a pixel electrode electrically connected to one of the first through fourth electrodes.

8. The flat panel display device of claim 7, wherein the second plane and the third plane are identical, the second gate electrode partially surrounding the first gate electrode.

9. The flat panel display device of claim 7, wherein the second plane and the third plane are closer to the substrate than the semiconductor layer and the first plane.

10. The flat panel display device of claim 7, wherein the pixel electrode is connected to the first electrode.

11. The flat panel display device of claim 10, further comprising:
    a first capacitor electrode connected to the first gate electrode; and
    a second capacitor electrode connected to the second electrode.

12. The flat panel display device of claim 11, further comprising:
    a gate insulating layer arranged on the substrate and covering the first gate electrode, the second gate electrode, and the first capacitor electrode; and
    a protective layer arranged on the substrate and covering the first through fourth electrodes and the semiconductor layer, wherein the second plane and the third plane are closer to the substrate than the semiconductor layer and the first plane.

13. The flat panel display device of claim 12, wherein the second capacitor electrode covers at least a portion of the protective layer.

14. The flat panel display device of claim 12, wherein the third electrode partially surrounds the second electrode, the fourth electrode partially surrounds the third electrode, a protrusion that protrudes from the second electrode through an opening of the third electrode and an opening of the fourth electrode is arranged in the second electrode, the protrusion being connected to the second capacitor electrode.

15. The flat panel display device of claim 12, wherein the first through fourth electrodes are arranged on the gate insulating layer, the semiconductor layer is arranged to cover the first through fourth electrodes, and the second capacitor electrode is arranged on the gate insulating layer.

16. The flat panel display device of claim 12, wherein the semiconductor layer is arranged on the gate insulating layer, the first through fourth electrodes are arranged on the semiconductor layer, and the second capacitor electrode is arranged on the semiconductor layer.

17. The flat panel display device of claim 12, wherein the first capacitor electrode is connected to the third electrode.

18. The flat panel display device of claim 17, wherein the fourth electrode partially surrounds the third electrode, a protrusion that protrudes from the third electrode through the opening of the fourth electrode is arranged in the third electrode, and the protrusion is connected to the first capacitor electrode.

19. The flat panel display device of claim 12, wherein the first capacitor electrode is connected to the fourth electrode.

20. The flat panel display device of claim 7, wherein the pixel electrode is connected to the second electrode.

21. The flat panel display device of claim 20, further comprising:
a first capacitor electrode connected to the first gate electrode; and
a second capacitor electrode connected to the first electrode.

22. The flat panel display device of claim 21, further comprising:
a gate insulating layer arranged on the substrate and covering the first gate electrode, the second gate electrode, and the first capacitor electrode; and
a protective layer arranged on the substrate and covering the first through fourth electrodes and the semiconductor layer, wherein the first plane and the semiconductor layer are further from the substrate than the second plane and the third plane.

23. The flat panel display device of claim 22, wherein the second capacitor electrode is arranged above the protective layer.

24. The flat panel display device of claim 22, wherein the second electrode partially surrounds the first electrode, the third electrode partially surrounds the second electrode, the fourth electrode partially surrounds the third electrode, a protrusion that protrudes from the first electrode through an opening of the second electrode, an opening of the third electrode, and an opening of the fourth electrode is arranged in the first electrode, and the protrusion being connected to the second capacitor electrode.

25. The flat panel display device of claim 22, wherein the first through fourth electrodes are arranged on the gate insulating layer, the semiconductor layer is arranged to cover the first through fourth electrodes, and the second capacitor electrode is arranged on the gate insulating layer.

26. The flat panel display device of claim 22, wherein the semiconductor layer is arranged on the gate insulating layer, the first through fourth electrodes are arranged on the semiconductor layer, and the second capacitor electrode is arranged on the semiconductor layer.

27. The flat panel display device of claim 22, wherein the first capacitor electrode is connected to the third electrode.

28. The flat panel display device of claim 27, wherein the fourth electrode partially surrounds the third electrode, a protrusion that protrudes from the third electrode through the opening of the fourth electrode is arranged in the third electrode, and the protrusion being connected to the first capacitor electrode.

29. The flat panel display device of claim 22, wherein the first capacitor electrode is connected to the fourth electrode.

30. The flat panel display device of claim 7, wherein the pixel electrode is connected to the third electrode.

31. The flat panel display device of claim 30, further comprising:
a first capacitor electrode connected to the second gate electrode; and
a second capacitor electrode connected to the fourth electrode.

32. The flat panel display device of claim 31, wherein the second gate electrode and the first capacitor electrode are arranged as one body, and the fourth electrode and the second capacitor electrode are arranged as one body.

33. The flat panel display device of claim 31, further comprising:
a gate insulating layer arranged on the substrate and covering the first gate electrode, the second gate electrode, and the first capacitor electrode; and
a protective layer arranged on the substrate and covering the first through fourth electrodes and the semiconductor layer, wherein the first through fourth electrodes and the semiconductor layer are arranged above the first gate electrode and the second gate electrode.

34. The flat panel display device of claim 31, wherein the first electrode is connected to the second gate electrode.

35. The flat panel display device of claim 34, wherein the second electrode partially surrounds the first electrode, the third electrode partially surrounds the second electrode, a protrusion that protrudes from the first electrode through an opening of the second electrode and an opening of the third electrode is arranged in the first electrode, and the protrusion being connected to the second gate electrode.

36. The flat panel display device of claim 31, wherein the second electrode is connected to the second gate electrode.

37. The flat panel display device of claim 36, wherein the third electrode partially surrounds the second electrode, a protrusion that protrudes from the second electrode through the opening of the third electrode is arranged in the second electrode, and the protrusion is connected to the second gate electrode.

38. The flat panel display device of claim 7, wherein the semiconductor layer is an organic semiconductor layer.

39. The flat panel display device of claim 7, wherein light generated in the display element is emitted away through the substrate.

40. The flat panel display device of claim 7, wherein the display element is an electroluminescent element.

* * * * *